(12) United States Patent
Mann et al.

(10) Patent No.: US 8,970,819 B2
(45) Date of Patent: Mar. 3, 2015

(54) MICROLITHOGRAPHY PROJECTION OPTICAL SYSTEM, TOOL AND METHOD OF PRODUCTION

(75) Inventors: Hans-Juergen Mann, Oberkochen (DE); Wilhelm Ulrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1437 days.

(21) Appl. No.: 12/235,957

(22) Filed: Sep. 23, 2008

(65) Prior Publication Data
US 2009/0051890 A1 Feb. 26, 2009

Related U.S. Application Data

(63) Continuation of application No. PCT/EP2007/000068, filed on Jan. 5, 2007, which is a continuation-in-part of application No. PCT/EP2006/008869, filed on Sep. 12, 2006.

(60) Provisional application No. 60/793,387, filed on Apr. 7, 2006.

(51) Int. Cl.
*G03B 27/42* (2006.01)
*G03F 7/20* (2006.01)
*G03F 1/62* (2012.01)

(52) U.S. Cl.
CPC ............ *G03F 7/702* (2013.01); *G03F 7/70233* (2013.01); *G03F 1/62* (2013.01)
USPC ................. 355/53; 355/55; 355/67; 359/365; 359/366; 359/857

(58) Field of Classification Search
CPC ....... G03F 7/70233; G03F 1/24; G03F 7/702; G03F 7/70116; G03F 7/70225; G03F 1/22; G03F 7/20; G03F 7/7025; G03F 7/70258; G03F 9/70
USPC ................. 355/53, 55, 67; 359/365, 366, 857
See application file for complete search history.

(56) References Cited

U.S. PATENT DOCUMENTS 4,650,292 A 3/1987 Baker et al.
5,063,586 A 11/1991 Jewell et al.
(Continued)

FOREIGN PATENT DOCUMENTS

DE 102 12 405 10/2002
DE 103 59 576 7/2005
(Continued)

OTHER PUBLICATIONS

English translation of Office Action for corresponding Application No. JP 2008-529565, dated Feb. 21, 2011.
(Continued)

*Primary Examiner* — Steven H Whitesell Gordon
*Assistant Examiner* — Mesfin T Asfaw
(74) *Attorney, Agent, or Firm* — Fish & Richardson P.C.

(57) ABSTRACT

A microlithography projection optical system is disclosed. The system can include a plurality of optical elements arranged to image radiation having a wavelength λ from an object field in an object plane to an image field in an image plane. The plurality of optical elements can have an entrance pupil located more than 2.8 m from the object plane. A path of radiation through the optical system can be characterized by chief rays having an angle of 3° or more with respect to the normal to the object plane. This can allow the use of phase shifting masks as objects to be imaged, in particular for EUV wavelengths.

34 Claims, 11 Drawing Sheets

(56) References Cited

U.S. PATENT DOCUMENTS

| | | | |
|---|---|---|---|
| 5,071,240 A | 12/1991 | Ichihara et al. | |
| 5,309,276 A | 5/1994 | Rodgers | |
| 5,361,292 A * | 11/1994 | Sweatt | 378/34 |
| 5,815,310 A * | 9/1998 | Williamson | 359/365 |
| 6,033,079 A * | 3/2000 | Hudyma | 359/857 |
| 6,072,852 A | 6/2000 | Hudyma | |
| 6,142,641 A * | 11/2000 | Cohen et al. | 359/859 |
| 6,172,825 B1 | 1/2001 | Takahashi | |
| 6,226,346 B1 | 5/2001 | Hudyma | |
| 6,229,595 B1 | 5/2001 | McKinley et al. | |
| 6,240,158 B1 | 5/2001 | Oshino | |
| 6,244,717 B1 | 6/2001 | Dinger | |
| 6,266,389 B1 | 7/2001 | Murayama et al. | |
| 6,302,548 B2 | 10/2001 | Takahashi et al. | |
| 6,318,869 B1 | 11/2001 | Hudyma | |
| 6,353,470 B1 | 3/2002 | Dinger | |
| 6,426,506 B1 | 7/2002 | Hudyma | |
| 6,549,270 B1 | 4/2003 | Ota | |
| 6,557,443 B1 | 5/2003 | Larue | |
| 6,577,443 B2 | 6/2003 | Dinger | |
| 6,600,552 B2 | 7/2003 | Dinger | |
| 6,660,552 B2 | 12/2003 | Payne et al. | |
| 6,710,917 B2 | 3/2004 | Mann et al. | |
| 6,850,361 B1 | 2/2005 | Nakano et al. | |
| 6,902,283 B2 | 6/2005 | Dinger | |
| 6,922,291 B2 | 7/2005 | Sunaga et al. | |
| 6,929,373 B2 | 8/2005 | Yoshikawa et al. | |
| 6,947,210 B2 | 9/2005 | Terasawa | |
| 7,114,818 B2 | 10/2006 | Minakata | |
| 7,224,441 B2 | 5/2007 | Sasaki | |
| 7,232,233 B2 | 6/2007 | Suzuki et al. | |
| 7,414,781 B2 | 8/2008 | Mann et al. | |
| 7,682,031 B2 | 3/2010 | Mann et al. | |
| 2001/0002155 A1 | 5/2001 | Takahashi et al. | |
| 2002/0012100 A1 | 1/2002 | Shafer | |
| 2002/0191161 A1 * | 12/2002 | Baba et al. | 353/98 |
| 2003/0063375 A1 | 4/2003 | Suzuki et al. | |
| 2003/0076483 A1 | 4/2003 | Komatsuda | |
| 2003/0086524 A1 * | 5/2003 | Schultz et al. | 378/34 |
| 2003/0147130 A1 | 8/2003 | Terasawa | |
| 2003/0147131 A1 | 8/2003 | Terasawa | |
| 2004/0037387 A1 * | 2/2004 | Antoni et al. | 378/34 |
| 2004/0051852 A1 | 3/2004 | Komatsuda | |
| 2004/0070743 A1 | 4/2004 | Hudyma et al. | |
| 2004/0090609 A1 | 5/2004 | Komatsuda | |
| 2004/0165255 A1 | 8/2004 | Sasaki et al. | |
| 2004/0189965 A1 | 9/2004 | Takahashi | |
| 2004/0189968 A1 | 9/2004 | Terasawa | |
| 2005/0036213 A1 | 2/2005 | Mann et al. | |
| 2005/0134980 A1 | 6/2005 | Mann et al. | |
| 2006/0209302 A1 | 9/2006 | Sasaki | |
| 2006/0232867 A1 | 10/2006 | Mann et al. | |
| 2006/0284113 A1 | 12/2006 | Chang et al. | |
| 2007/0195317 A1 | 8/2007 | Schotter et al. | |
| 2009/0051890 A1 | 2/2009 | Mann et al. | |

FOREIGN PATENT DOCUMENTS

| | | |
|---|---|---|
| EP | 0 730 169 | 9/1996 |
| EP | 0 730 179 | 9/1996 |
| EP | 0 730 180 | 9/1996 |
| EP | 0 744 665 | 11/1996 |
| EP | 0 779 528 | 6/1997 |
| EP | 0779528 | 6/1997 |
| EP | 0 790 513 | 8/1997 |
| EP | 1 333 260 A2 | 8/2003 |
| EP | 1 335 228 A1 | 8/2003 |
| EP | 1 335 229 | 8/2003 |
| EP | 1 413 909 | 4/2004 |
| EP | 1 434 093 | 6/2004 |
| EP | 1 450 196 | 8/2004 |
| EP | 1 450 209 | 8/2004 |
| EP | 1 494 056 | 1/2005 |
| EP | 1 376 191 | 1/2007 |
| JP | 07-036959 | 2/1995 |
| JP | 07 283116 | 10/1995 |
| JP | 2000-098228 | 4/2000 |
| JP | 2000-098230 | 4/2000 |
| JP | 2000-100703 | 4/2000 |
| JP | 2001-185480 | 7/2001 |
| JP | 2002-015979 | 1/2002 |
| JP | 2002-139672 | 5/2002 |
| JP | 2003-015040 | 1/2003 |
| JP | 2003-045782 | 2/2003 |
| JP | 2003-222572 | 8/2003 |
| JP | 2003-233001 | 8/2003 |
| JP | 2003-233002 | 8/2003 |
| JP | 2004-022722 | 1/2004 |
| JP | 2004-029625 | 1/2004 |
| JP | 2004-31808 A | 1/2004 |
| JP | 2004-512552 | 4/2004 |
| JP | 2004-516500 | 6/2004 |
| JP | 2004-214242 | 7/2004 |
| JP | 2004-525398 | 8/2004 |
| JP | 2004-258541 | 9/2004 |
| JP | 2005-055553 | 3/2005 |
| JP | 2005-166778 | 6/2005 |
| JP | 2005-172988 | 6/2005 |
| TW | 594043 | 6/2004 |
| TW | 200632372 A | 9/2006 |
| WO | WO 02/48796 | 6/2002 |
| WO | WO 02/056114 | 7/2002 |
| WO | WO 2006/069725 | 7/2006 |

OTHER PUBLICATIONS

National Science Foundation article, "Breakthrough Brings Laser Light to New Regions of the Spectrum," NSF PR 03-01; date: Jan. 2, 2003.

Bal, Matthieu Frédéric, dissertation "Next-Generation Extreme Ultraviolet Lithographic Projection Systems", pp. 1-139, (Feb. 10, 2003).

T. Jewell "Optical system design issues in development of projection camera for EUV lithography", *SPIE* vol. 2437, p. 340-364.

Office Action for corresponding Application No. JP 2008-529565, dated Dec. 7, 2009.

Office Action dated Jun. 23, 2009, issued for U.S. Appl. No. 12/233,384.

The English translation of Japanese office action, for corresponding JP Appl No. 2009-503431, dated Mar. 25, 2012.

Office Action issued for U.S. Appl. No. 12/233,384, dated Jun. 23, 2009.

English translation of Japanese office action for corresponding JP Application No. 2009-503 430, dated Feb. 27, 2012.

Taiwanese Office Action, with translation thereof, for corresponding TW Appl No. 96105706, dated May 24, 2013.

Chinese office action, with English translation thereof, for corresponding CN Appl No. 2007 8001 2528.9, dated Aug. 28, 2013.

Office Action in the related Japanese application, No. JP2009-503431, with English translation, 10 pages, dated Apr. 1, 2013.

B. Tatian, "Nonrotationally Symmetric Systems: A New Problem for Optical Design and Fabrication, Applications of Geometrical Optics", Proc. SPIE, 39:205, (1973).

B. Tatian, "Testing an Unusual Optical Surface", International Lens Design Conference, Proc. SPIE, 554:139, (1985).

Taiwanese office action, with English translation thereof, for corresponding TW Appl No. 97101634, dated Sep. 10, 2013.

Korean office action, with English translation thereof, for corresponding KR Appl No. 10-20087027380, dated Dec. 25, 2013.

Japanese office action, with English translation thereof, for JP Appl No. 2013-206 713, dated Aug. 1, 2014.

* cited by examiner

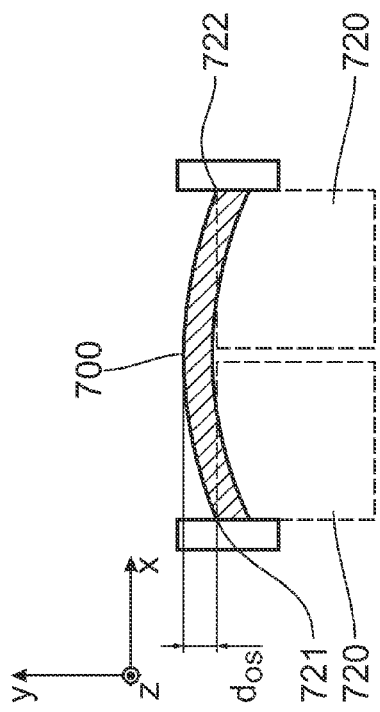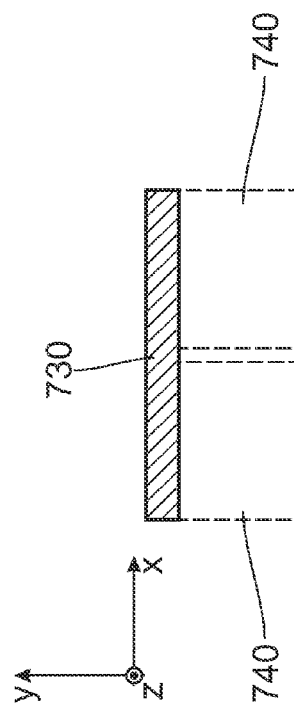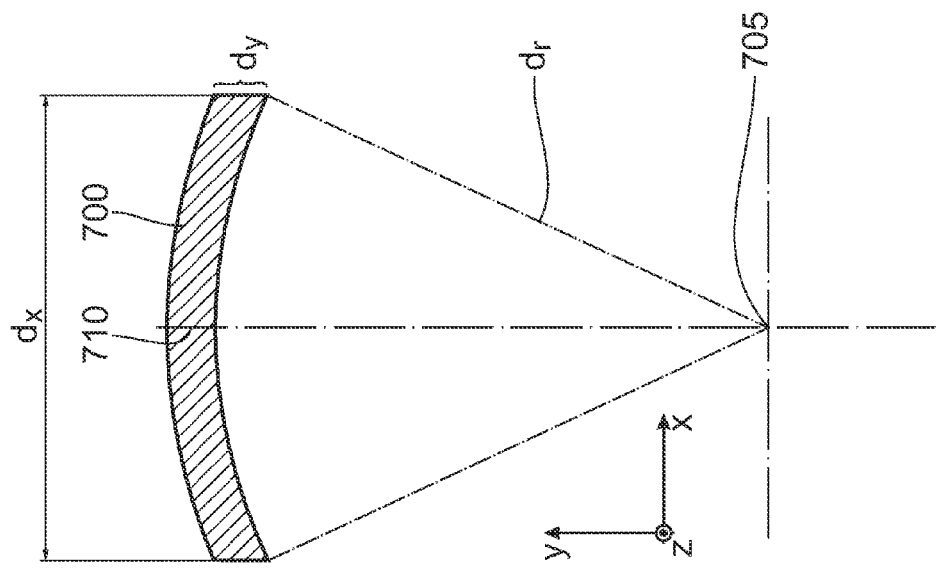

MICROLITHOGRAPHY PROJECTION OPTICAL SYSTEM, TOOL AND METHOD OF PRODUCTION

CROSS-REFERENCE TO RELATED APPLICATIONS

This application is a continuation of International Application No. PCT/EP2007/000068, filed Jan. 5, 2007, which is a continuation-in-part of International Application No. PCT/EP2006/008869, filed Sep. 12, 2006. International Application No. PCT/EP2007/000068 also claims the benefit of U.S. Ser. No. 60/793,387, filed Apr. 7, 2006. International Application No. PCT/EP2007/000068 is incorporated by reference herein in its entirety.

FIELD

This disclosure relates to a microlithography projection optical system, such as a projection objective, a microlithographic tool including such an optical system, a method for microlithographic production of microstructured components using such a microlithographic tool and a microstructured component produced by such a method.

BACKGROUND

Projection objectives are widely used in microlithography to transfer a pattern from a reticle to a substrate by forming an image of the reticle on a layer of a photosensitive material disposed on the substrate. In general, projection objectives fall into three different classes: dioptric objectives; catoptric objectives; and catadioptric objectives. Dioptric objectives use refractive elements (e.g., lens elements) to image light from an object plane to an image plane. Catoptric objectives use reflective elements (e.g., mirror elements) to image light from an object plane to an image plane. Catadioptric objectives use both refractive and reflective elements to image light from an object plane to an image plane.

SUMMARY

In some embodiments, the disclosure provides a microlithography projection optical system that is flexible with respect to different types of masks or reticles to be imaged.

In one aspect, the disclosure features a microlithography projection optical system that includes a plurality of optical elements arranged to image radiation from an object field in an object plane to an image field in an image plane. The system has an entrance pupil located more than 2.8 m from the object plane. A path of the radiation of the system has chief rays that are at an angle of 3° or more with respect to a normal at the object plane.

In another aspect, the disclosure features a microlithography tool that includes an illumination system and a microlithography projection optical system as described in the preceding paragraph.

In a further aspect, the disclosure features a EUV microlithography tool that includes an optical projection system including a plurality of optical elements arranged to image radiation having a wave length $\lambda$ from an object field in an object plane of the optical projection system to an image field in an image plane of the optical projection system. The optical projection system is telecentric at the object plane of the optical projection system. The microlithography tool also includes a radiation source configured to provide the radiation at $\lambda$ to the object plane of the optical projection system, where $\lambda$ is 30 nm or less. In addition, the microlithography tool includes an illumination system having one or more elements arranged to direct radiation from the radiation source to the object plane of the optical projection system.

In an additional aspect, the disclosure features a method that includes using a tool as described in either of the two preceding paragraphs to produce micro-structured components.

In some embodiments, due in part at least to the entrance pupil of the optical system being located more than 2.8 m from the object plane, the chief rays are substantially parallel to each other at the object plane. Uniformity of the chief ray directions at the reticle can reduce or avoid field dependency of shading effects at the reticle. These shading effects can lead to a unwanted field dependency of the imaging properties of projection objective, such as, for example, the resolution limit. Accordingly, uniformity of the chief ray directions can reduce these field dependent imaging properties, providing an image that has improved uniformity across the field. Furthermore, chief rays being substantially parallel to each other and to the normal of the object plane allow the use of phase shifting masks, especially to be imaged by EUV wavelengths. An angle between the normal at the object plane and the chief rays of 3° or more makes possible both a separation of an illumination ray path and a projection ray path. This can facilitate the use of a reflective object to be imaged.

In general, the image plane of the optical system is parallel to the object plane. The projection objective may include four or more (e.g., six or more) reflective elements. The projection objective may include three, four, five or six elements that are reflective elements having rotationally asymmetric surfaces positioned in a path of the radiation. The optical system may have a field at the image plane having a minimum radius of curvature of 300 mm. For a meridional section of the optical system, the chief rays may have a maximum angle of incidence on a surface of each of the elements of less than 20° (e.g., less than 18°, less than 15°). Due to its telecentricity at the object side, the optical system has an entrance pupil located at infinity. Imaged radiation may be reflected from an object positioned at the object plane. Such an object may be a phase shift mask. In general the object positioned at the object plane is a reticle that is imaged by the plurality of elements to the image plane. The optical system may have a demagnification of 4×. The plurality of elements will be arranged to image the radiation to an intermediate image plane between the object plane and the image plane. In this case, a field stop may be provided positioned at or near the intermediate image plane. The projection objective may include five elements and an intermediate image plane may be located between a fourth element and a fifth element along the path of the radiation from the object plane to the image plane. The object and image planes may be separated by a distance L being about 1 m or more. The optical path length of the radiation from the object plane to the image plane may be about 2 L or more (e.g., about 3 L or more, about 4 L or more). The projection objective may include at least one pair of adjacent elements in the path of the radiation, where the pair of adjacent elements is separated by about 0.5 L or more. Advantageously, none of the plurality of elements causes an obscuration of the exit pupil at the image plane. The plurality of elements may include four or more elements that have free boards of about 25 mm or less. The four or more elements may have free boards of about mm or more. The plurality of elements may include a first mirror and a second mirror, the first and second mirrors having a minimum distance from the object plane of $d_1$ and $d_2$, respectively, where $d_1/d_2$ is about 2 or more or where $d_1/d_2$ is less than 2. The plurality of elements may include a first element in the path of the radiation from the object plane to the image plane, where the first element has positive optical power. The optical system may include an aperture stop positioned between the object plane and the image plane. The plurality of elements of the optical system may include three elements and the aperture stop may be positioned between the second and third elements in the path of the radiation from the object plane to the image plane. Alternatively, the aperture stop may be positioned at the second element or at the third element or at some other position in the projection lens, e.g. between the first and the second element. The radiation may pass through the aperture stop once or twice. A radiation source which is used with the optical system according to the disclosure may be a laser radiation source having a wavelength of about 300 nm or less (e.g., 200 nm or less, 100 nm or less).

In some embodiments, in a telecentric optical system, the chief rays at the object plane are parallel to each other within a certain deviation limit. For example, the chief rays can be parallel to each other to within about 0.5° or less (e.g., about 0.4° or less, about 0.3° or less, about 0.2° or less, about 0.1° or less, about 0.05° or less, 0.01° or less) at the object plane.

In certain embodiments, the chief angle to the normal at the object plane can provide a good separation between the illumination and projection ray path. The higher this angle is, the more separation is possible at a given distance. Advantageously, the angle between the chief rays and the object plane normal is 5° or more (7° or more).

In some embodiments, the system can include a reflective object, such as a phase shift mask. This can exploit advantageously the possibilities of the optical system.

In certain embodiments, the projection objective is a catoptric projection objective. Such a projection objective having exclusively reflective components can be used with ultra short wavelengths, in particular with EUV wavelengths being below 30 mm.

In the following specification, a rotationally asymmetric surface according to the disclosure also is referred to as a freeform surface. Unlike spherical or aspherical mirrors, freeform surfaces do not have an axis of rotational symmetry. Freeform surfaces according to the present disclosure differ from known aspheric rotational symmetric mirror surfaces for EUV projection objectives in that such known aspheric mirror surfaces are described via a mathematical Taylor expansion, i.e. having a sag being given by a rotational symmetric polynomial of grade n. The center point of this Taylor expansion for all these polynomial terms is defined by a common optical axis. Known mirror surfaces are described by such an expansion, because the Taylor expansion is easy to calculate, easy to optimize and there exists a lot of experience in manufacturing such mirror surfaces. However, it was realized by the inventors that the known Taylor expansion with common center leads to an unwanted distortion which cannot be lowered below a certain level. This distortion limitation being inherent to rotational symmetric optical surfaces is avoided, when according to the disclosure one of the optical surfaces is embodied as free-form or rotationally asymmetric surface. In some embodiments, a freeform surface may be a surface being mirror symmetric to a meridional plane of the optical system. In certain embodiments, a deviation of the rotationally asymmetric surface from a best-fit rotationally symmetric surface can give the possibility to eliminate higher aberration values, in particular aberrations being in the order of several wavelengths of the illuminating radiation.

A mathematical expansion of the freeform surface according to some embodiments can give a good and reproducible manufacturing of the reflecting surfaces. In this expansion, $\alpha$ may be 66, for example. Further, m may consist of even integers, for example. Further, m+n may be equal or bigger than 10, for example.

A deviation according to certain embodiments can provide for a proper reduction of the objective's distortion below the limit which is reachable using rotationally symmetric optical surfaces. The rotational asymmetric surface may deviate from the best-fit rotational symmetric surface by about 50 nm or more (e.g., about 100 nm or more, about 500 nm, about 1000 nm or more) at the one or more locations.

In some embodiments, the plurality of reflective elements define a meridional plane, and the elements are mirror symmetric with respect to the meridional plane. In such embodiments, for example, restrictions on producing a free-form optical surface may be reduced.

In some embodiments, two reflective elements having optical surfaces can lead to the possibility of a better aberration minimization or give the possibility to meet such an aberration minimization desired property with freeform surfaces being less complicated to manufacture. The optical system also may have three, four, five or six freeform elements.

In certain embodiments, an optical system having no more than two reflective elements with a positive chief ray angle magnification can exhibit a relatively low incident ray angles on the mirrors, thus causing lower aberrations at the outset. In some embodiments, this can hold when using an optical system including only one reflective element having a positive chief ray angle magnification, such as for systems having at least one intermediate image.

A numerical aperture of the optical system according to some embodiments can allow a high resolution. The image-side numerical aperture be as high as 0.25 or more (e.g., 0.28 or more, 0.3 or more, 0.35 or more, 0.4 or more).

An image field dimension according to some embodiments can enable an efficient use of the optical system in a microlithography projection apparatus. A rectangular field may have a minimum dimension of about 2 mm and may have a first dimension of about 1 mm or more and second dimension of about 1 mm or more, where the first and second dimensions are orthogonal and are measured in the image plane. This second dimension may be about 10 mm or more (e.g., about 20 mm or more).

A distortion according to some embodiments and a wavefront error according to certain embodiments can lead to a projection quality which only may be limited by diffraction, i.e. by the wavelength of the projection light. An optical system with such low distortion in particular is optimized for use the EUV light sources in the range between 10 and 30 nm.

Within a low limit according to some embodiments parallel chief rays lead to a high quality telecentric optical system at the object plane.

A telecentric optical system according to certain embodiments tolerates height variations of a substrate due to non flat wafer topography arranged in the image plane or allows for defocusing of the image plane without any change in the magnification ratio.

An optical system according to certain embodiments can lead to a very high resolution. The ration $\theta$/NA may be about 60 or less (e.g., 50 or less).

An optical system with an object-image shift of about 75 mm or less according to some embodiments can lead to a slim optical design of the optical system. The object-image shift may be about 50 mm or less (e.g., about 25 mm or less). In case of zero object-image shift, the optical system can be rotated about the axis intersecting the center field points in the object and image fields without the central field point translating. This is in particular advantageous where metrology and testing tools are used involving rotation of the optical system.

An optical system having a radiation source according to certain embodiments can exploit advantageously the aberration minimization by use of the at least one freeform surface, as reduction to aberrations and distortions in the range of the wavelength of such a radiation source are possible. Optionally, the wavelength is in a range from about 10 nm to about 15 nm.

The advantages of an optical system according to some embodiments and of the microlithographic tools according to certain embodiments can correspond to those mentioned. The same holds with respect to certain embodiments of methods of manufacturing.

Embodiments can include one or more of the following advantages.

In some embodiments, a catoptric projection objectives is telecentric at the image plane. This can provide for constant or nearly constant image magnification over a range of image-side working distances.

In certain embodiments, catoptric projection objectives have extremely high resolution. For example, projection objectives can have the capability of resolving structures smaller than about 50 nm. High resolution can be achieved in projection objectives that have a high image-side numerical aperture that are designed for operation at short wavelengths (e.g., about 10 nm to about 30 nm).

In some embodiments, a projection objective can provide images with low aberrations. In certain embodiments, projection objectives are corrected for wavefront error of about 30 m$\lambda$ or less. In certain embodiments, projection objectives are corrected for distortion below values of about 2 nm or less.

In certain embodiments, a catoptric objective has a high numerical aperture and provides imaging with low image distortion, low wavefront error, and telecentricity at the image plane over a relatively large image field. These features can be achieved by use of one or more freeform mirrors.

In some embodiments, projection objective metrology can be easily implemented despite rotations of the projection objective about a rotation axis. For example, embodiments of projection objectives (e.g., high NA projection objectives) may have relatively small or zero object-image shift which result in little or no translation of the central field point when the projection objective rotates about the axis. Thus, when the projection objective is subject to rotation, metrology can be repeatable performed in the same field position without having to relocate that field position.

In certain embodiments, a catoptric projection objection has no field dependent pupil obscuration or no central pupil obscuration at all.

In some embodiments, a projection objective can be adapted for operation at a variety of different wavelengths, including visible and ultraviolet (UV) wavelengths. Embodiments can be adapted for operation at Extreme UV (EUV) wavelengths. Furthermore, embodiments can be adapted for use at more than one wavelength, or over a range of wavelengths.

In some embodiments, a catoptric projection objective can be used in lithography tools (e.g., lithography scanners) and can provide relatively low overscan. Low overscan is accomplished, for example, by using projection objectives with rectangular image fields. In such embodiments, the image can be aligned so that an edge of the rectangular field is parallel to the leading edge of the die sites, avoiding scanning the leading edge of the die sites beyond the edge of the image field in order to scan the site corners, as is typically the case when rectangular or square die sites are scanned relative to arcuate fields.

In certain embodiments, lithography tools with relatively high throughput are provided. For example, embodiments having relatively low overscan are more efficient than comparable systems that have larger overscan. Accordingly, these low overscan systems can provide higher wafer throughput than the comparable systems.

In some embodiments, catoptric projection objectives are provided that have low or no field dependence of shading effects. For example, catoptric projection objectives can have their entrance pupil located far from the object plane (e.g., at infinity) providing uniform illumination angles of the chief rays on the object field. This can reduce or avoid field dependent shading effects that occurs where chief ray angles vary across the object field. Alternatively, or additionally, projection objectives can have relatively small values chief ray incident angles and/or small variations of incident angles for rays in the meridional section for each mirror in the projection objective, resulting in an increased average reflectivity of each mirror.

Other features and advantages will be apparent from the description, the drawings, and the claims.

All or selected features from the claims or subclaims may be combined to form embodiments which are in particular advantageous.

BRIEF DESCRIPTION OF THE DRAWINGS

FIG. 7A is a plan view of an embodiment of a ring segment field.

FIG. 7B is a plan view of a ring segment field relative to a pair of wafer die sites.

FIG. 7C is a plan view of a rectangular field relative to a pair of wafer die sites.

DETAILED DESCRIPTION

Figure 1:
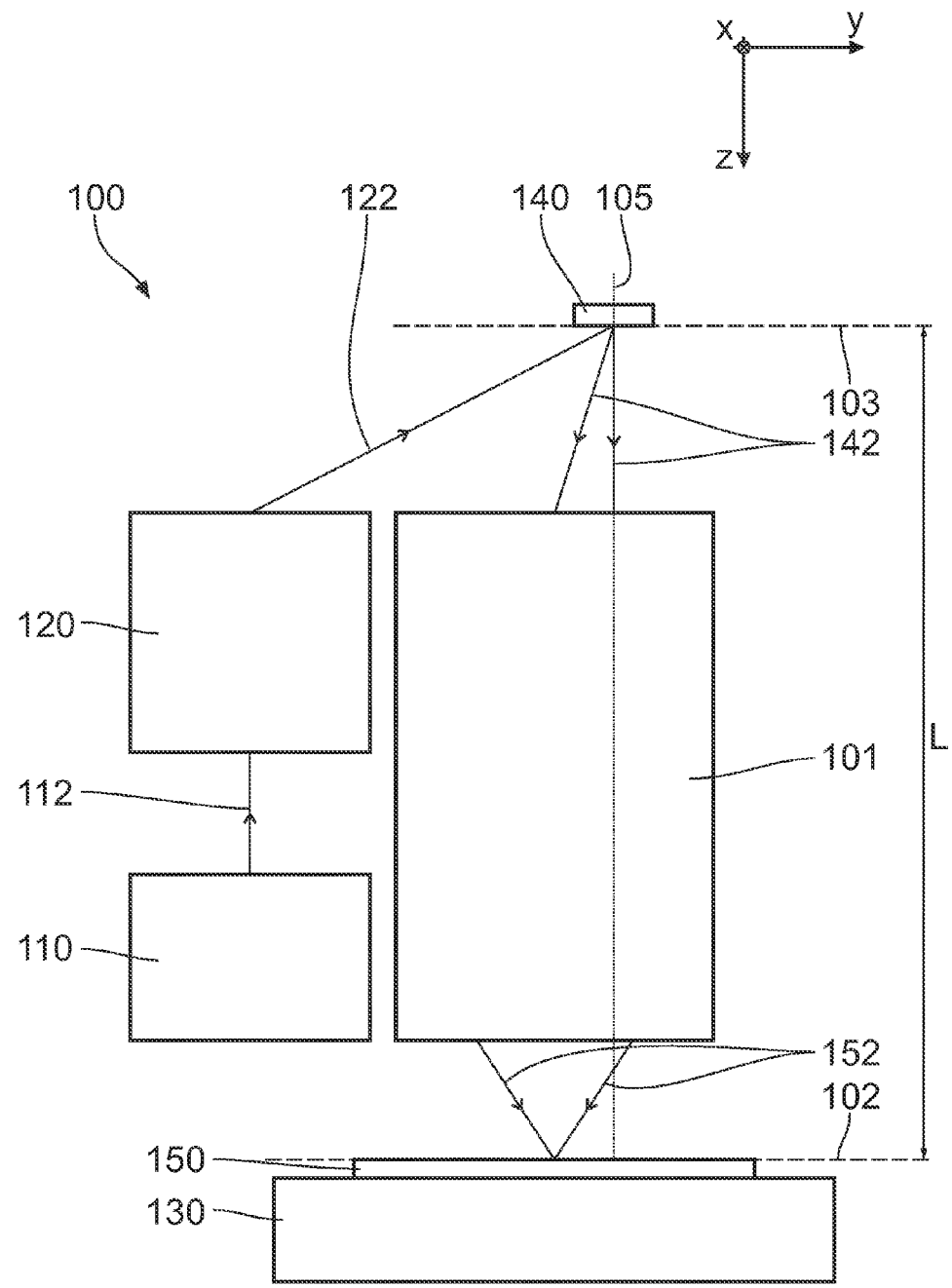
FIG. 1 is a schematic view of a microlithography tool.

In one aspect, the disclosure relates to catoptric projection objectives that have one or more mirrors having a freeform mirror surface (referred to as freeform mirrors). Catoptric projection objectives with freeform mirrors can be used in microlithography tools. Referring to FIG. 1, a microlithography tool 100 generally includes a light source 110, an illumination system 120, a projection objective 101, and a stage 130. A Cartesian coordinate system is shown for reference. Light source 110 produces radiation at a wavelength λ and directs a beam 112 of the radiation to illumination system 120. Illumination system 120 interacts with (e.g., expands and homogenizes) the radiation and directs a beam 122 of the radiation to a reticle 140 positioned at an object plane 103. Projection objective 101 images radiation 142 reflected from reticle 140 onto a surface of a substrate 150 positioned at an image plane 102. The radiation on the image-side of projection objective 101 is depicted as rays 152. As shown in FIG. 1, the rays are illustrative only and not intended to be accurately depict the path of the radiation with respect to reticle 140, for example. Substrate 150 is supported by stage 130, which moves substrate 150 relative to projection objective 101 so that projection objective 101 images reticle 140 to different portions of substrate 150.

Projection objective 101 includes a reference axis 105. In embodiments where projection objective is symmetric with respect to a meridional section, reference axis 105 is perpendicular to object plane 103 and lies inside the meridional section.

Light source 110 is selected to provide radiation at a desired operational wavelength, λ, of tool 100. In some embodiments, light source 110 is a laser light source, such as a KrF laser (e.g., having a wavelength of about 248 nm) or an ArF laser (e.g., having a wavelength of about 193 nm). Non-laser light sources that can be used include lightemitting diodes (LEDs), such as LEDs that emit radiation in the blue or UV portions of the electromagnetic spectrum, e.g., about 365 nm, about 280 nm or about 227 nm.

Typically, for projection objectives designed for operation in lithography tools, wavelength λ is in the ultraviolet portion, the deep ultraviolet portion or the extreme ultraviolet portion of the electromagnetic spectrum. For example, λ can be about 400 nm or less (e.g., about 300 nm or less, about 200 nm or less, about 100 nm or less, about 50 nm or less, about 30 nm or less). λ can be more than about 2 nm (e.g., about 5 nm or more, about 10 nm or more). In embodiments, λ can be about 193 nm, about 157 nm, about 13 nm, or about 11 nm. Using a relatively short wavelength may be desirable because, in general, the resolution of a projection objective is approximately proportional to the wavelength. Therefore shorter wavelengths can allow a projection objective to resolve smaller features in an image than equivalent projection objectives that use longer wavelengths. In certain embodiments, however, λ can be in non-UV portions of the electromagnetic spectrum (e.g., the visible portion).

Illumination system 120 includes optical components arranged to form a collimated radiation beam with a homogeneous intensity profile. Illumination system 120 typically also includes beam steering optics to direct beam 122 to reticle 140. In some embodiments, illumination system 120 also include components to provide a desired polarization profile for the radiation beam.

Object plane 103 is separated from image plane 102 by a distance L, which is also referred to as the lengthwise dimension, or tracklength, of projection objective 101. In general, this distance depends on the specific design of projection objective 101 and the wavelength of operation of tool 100. In some embodiments, such as in tools designed for EUV lithography, L is in a range from about 1 m to about 3 m (e.g., in a range from about 1.5 m to about 2.5 m). In certain embodiments, L is less than 2 m, such as about 1.9 m or less (e.g., about 1.8 m or less, about 1.7 m or less, about 1.6 m or less, about 1.5 m or less). L can be more than about 0.2 m or more (e.g., about 0.3 m or more, about 0.4 m or more, about 0.5 m or more, about 0.6 m or more, about 0.7 m or more, about 0.8 m or more, about 0.9 m or more, about 1 m or more).

The ratio of the optical path length of imaged radiation to the tracklength varies depending on the specific design of projection objective 101. In some embodiments, the ratio of this optical path length to tracklength can be relatively high. For example, the ratio of this optical path length to tracklength can be about two or more (e.g., about 2.5 or more, about three or more, about 3.5 or more, about four or more, about 4.5 or more, about five or more).

Projection objective 101 has a magnification ratio, which refers to the ratio of the dimensions of the field at object plane 103 to the corresponding dimensions of the field at image plane 102. Typically, projection objectives used in lithography tools are reduction projection objectives, meaning they reduce the dimensions of, or demagnify, the image.

In some embodiments, therefore, projection objective 101 can produce a field at image plane 102 whose dimensions are reduced by about 2× or more (e.g., about 3× or more, about 4× or more, about 5× or more, about 6× or more, about 7× or more, about 8× or more, about 9× or more, about 10× or more) compared to the dimensions at object plane 103. In other words, projection objective 101 can have a demagnification of about 2× or more, (e.g., about 3× or more, about 4× or more, about 5× or more, about 6× or more, about 7× or more, about 8× or more, about 9× or more, about 10× or more). More generally, however, projection objectives can be designed to provide a magnified image or an image the same size as the object.

Figure 2:
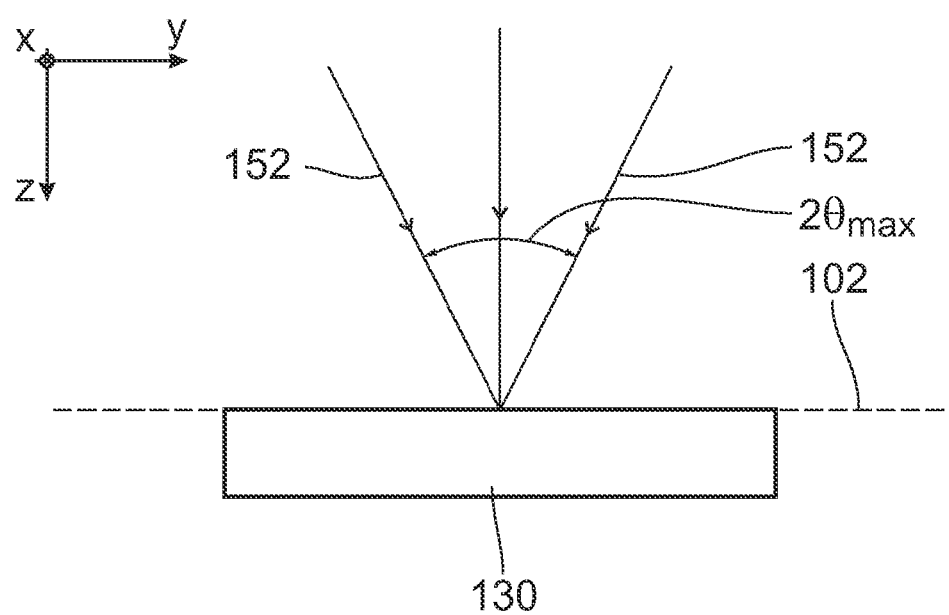
FIG. 2 is a schematic view showing a portion of the microlithography tool shown in FIG. 1.

Referring also to FIG. 2, rays 152 define a cone of light paths that form the reticle image at image plane 102. The angle of the cone of rays is related to the image-side numerical aperture (NA) of projection objective 101. Image-side NA can be expressed as $$NA = n_o \sin \theta_{max},$$

where $n_o$ refers to the refractive index of the immersing medium adjacent the surface of substrate 150 (e.g., air, nitrogen, water, or evacuated environment), and $\theta_{max}$ is the half-angle of the maximum cone of image forming rays from projection objective 101.

In general, projection objective 101 can have an image side NA of about 0.1 or more (e.g., about 0.15 or more, about 0.2 or more, about 0.25 or more, about 0.28 or more, about 0.3 or more, about 0.35 or more). In some embodiments, projection objective 101 has a relatively high image-side NA. For example, in some embodiments, projection objective 101 has an image-side NA of more than 0.4 (e.g., about 0.45 or more, about 0.5 or more, about 0.55 or more, about 0.6 or more). In general, the resolution of projection objective 101 varies depending on wavelength λ and the image-side NA. Without wishing to be bound by theory, the resolution of a projection objective can be determined based on the wavelength and image-side NA based on the formula, $$R = k \frac{\lambda}{NA},$$

where R is the minimum dimension that can be printed and k is a dimensionless constant called the process factor. k varies depending on various factors associated with the radiation (e.g., the polarization properties), the illumination properties (e.g., partial coherence, annular illumination, dipole settings, quadrupole settings, etc.) and the resist material. Typically, k is in a range from about 0.4 to about 0.8, but can also be below 0.4 and higher than 0.8 for certain applications.

Projection objective 101 is also nominally telecentric at the image plane. For example, the chief rays can deviate by about 0.5° or less (e.g., about 0.4° or less, about 0.3° or less, about 0.2° or less, about 0.1° or less, about 0.05° or less, 0.01° or less, 0.001° or less) from being parallel to each other at the image plane over the exposed field. Thus, projection objective 101 can provide substantially constant magnification over a range of image-size working distances. In some embodiments, the chief rays are nominally orthogonal to image plane 102. Thus, a non flat topography of the wafer surface or defocusing does not lead necessarily to distortion or shading effects in the image plane.

In certain embodiments, projection objective 101 has a relatively high resolution (i.e., the value of R can be relatively small). For example, R can be about 150 nm or less (e.g., about 130 nm or less, about 100 nm or less, about 75 nm or less, about 50 nm or less, about 40 nm or less, about 35 nm or less, about 32 nm or less, about 30 nm or less, about 28 nm or less, about 25 nm or less, about 22 nm or less, about 20 nm or less, about 18 nm or less, about 17 nm or less, about 16 nm or less, about 15 nm or less, about 14 nm or less, about 13 nm or less, about 12 nm or less, about 11 nm or less, such as about 10 nm).

The quality of images formed by projection objective 101 can be quantified in a variety of different ways. For example, images can be characterized based on the measured or calculated departures of the image from idealized conditions associated with Gaussian optics. These departures are generally known as aberrations. One metric used to quantify the deviation of a wavefront from the ideal or desired shape is the root-mean-square wavefront error ($W_{rms}$). $W_{rms}$ is defined in the "Handbook of Optics," Vol. I, $2^{nd}$ Ed., edited by Michael Bass (McGraw-Hill, Inc., 1995), at page 35.3, which is incorporated herein by reference. In general, the lower the $W_{rms}$ value for an objective, the less the wavefront deviates from its desired or ideal shape, and the better the quality of the image. In certain embodiments, projection objective 101 can have a relatively small $W_{rms}$ for images at image plane 102. For example, projection objective 101 can have a $W_{rms}$ of about $0.1\lambda$ or less (e.g., about $0.07\lambda$ or less, about $0.06\lambda$ or less, about $0.05\lambda$ or less, about $0.045\lambda$ or less, about $0.04\lambda$ or less, about $0.035\lambda$ or less, about $0.03\lambda$ or less, about $0.025\lambda$ or less, about $0.02\lambda$ or less, about $0.015\lambda$ or less, about $0.01\lambda$ or less, such as about $0.005\lambda$).

Another metric that can be used to evaluate the quality of the image is referred to as field curvature. Field curvature refers to the peak-to-valley distance for the field point dependent position of the focal plane. In some embodiments, projection objective 101 can have a relatively small field curvature for images at image plane 102. For example, projection objective 101 can have an image-side field curvature of about 50 nm or less (e.g., about 30 nm or less, about 20 nm or less, about 15 nm or less, about 12 nm or less, 10 nm or less).

A further metric that can be used to evaluate the optical performance is referred to as distortion. Distortion refers to the maximum absolute value of the field point dependent deviation from the ideal image point position in the image plane. In some embodiments, projection objective 101 can have a relatively small maximum distortion. For example, projection objective 101 can have a maximum distortion of about 50 nm or less, (e.g. about 40 nm or less, about 30 nm or less, about 20 nm or less, about 15 nm or less, about 12 nm or less, 10 nm or less, 9 nm or less, 8 nm or less, 7 nm or less, 6 nm or less, 5 nm or less, 4 nm or less, 3 nm or less, 2 nm or less, such as 1 nm).

Further, in certain embodiments, distortion can vary by a relatively small amount across the image field. For example, distortion can vary by about 5 nm or less (e.g., about 4 nm or less, about 3 nm or less, about 2 nm or less, about 1 nm or less) across the image field.

Being a catoptric system, projection objective 101 includes a number of mirrors arranged to direct radiation reflected from reticle 140 to substrate 150 in a way that forms an image of reticle 140 on the surface of substrate 150. Specific designs of projection objectives are described below. More generally, however, the number, size, and structure of the mirrors generally depends on the desired optical properties of projection objective 101 and the physical constraints of tool 100.

In general, the number of mirrors in projection objective 101 may vary. Typically, the number of mirrors is related to various performance trade-offs associated with the optical performance characteristics of the objective, such as the desired throughput (e.g., the intensity of radiation from the object that forms the image at image plane 102), the desired image-side NA and related image resolution, and the desired maximum pupil obscuration.

In general, projection objective 101 has at least four mirrors (e.g., five or more mirrors, six or more mirrors, seven or more mirrors, eight or more mirrors, nine or more mirrors, ten or more mirrors, eleven or more mirrors, twelve or more mirrors). In embodiments where it is desirable that all the mirrors of the objective are positioned between the object plane and the image plane, objective 101 will typically have an even number of mirrors (e.g., four mirrors, six mirrors, eight mirrors, ten mirrors). In certain embodiments, an odd number of mirrors can be used where all the mirrors of the projection objective are positioned between the object plane and image plane. For example, where one or more mirrors are tilted at relatively large angles, a projection objective can include an odd number of mirrors where all the mirrors are positioned between the object plane and image plane.

In general, at least one of the mirrors in projection objective 101 has a freeform surface. Unlike spherical or aspherical mirrors, freeform mirror surfaces do not have an axis of rotational symmetry. Generally, a freeform surface deviates from a best fit rotationally symmetric surface (e.g., a spherical or aspherical surface). Rotationally-symmetric reference surfaces can be determined for a freeform mirror surface as follows. First, one obtains information that characterizes the freeform mirror surface under consideration. In embodiments where optical data of the mirror is known, this information includes determining the basic radius of the mirror (e.g. 1/c, where c is the vertex curvature), a conic constant of the mirror, k, and polynomial coefficients characterizing the mirror. Alternatively, or additionally, the information characterizing the mirror can be obtained from a surface figure measurement of the mirror surface (e.g. obtained using an interferometer). A surface figure measurement can provide a function z'(x', y') describing the mirror's surface, where z' is the sag of the mirror surface along the z'-axis for different (x', y') coordinates, as illustrated in FIG. 2B. The initial step also includes determining the footprint for the mirror, which refers to an area of the mirror surface that is actually used to reflect image-forming radiation in the objective. The footprint can be determined by tracing rays through the objective using a ray tracing program and extracting the mirror area contacted by the rays.

After obtaining the information characterizing the rotationally asymmetric surface, a local coordinate system for the surface is established for which decentration and tilt of the surface is zero. Setting the tilt and decentration of the surface gives a well defined starting point for an optimization algorithm to determine the reference surface and also define an axis, z', along which the sag differences between the mirror surface and the reference surface can be determined. Where optical data for the mirror surface is known, the z'-axis is determined based on the conic constant, k, and basic radius, 1/c. For the rotationally symmetric portion of the optical data, the z'-axis is the symmetry axis for the rotationally symmetric part of the rotationally asymmetric surface. In embodiments where the mirror surface is characterized from a surface figure measurement, the z'-axis corresponds to the metrology axis (e.g. the interferometers optical axis). FIG. 2B illustrates this for a two-dimensional section of a rotationally asymmetric mirror 201, where the local coordinate system is denoted by the x', y' and z' axes. The boundaries for the footprint of the rotationally asymmetric mirror 201 are shown as $x_{min}$ and $x_{max}$ for the cross-section shown in FIG. 2B.

An initial reference surface is then established with respect to the coordinate system. The initial reference surface has zero tilt and zero decentration. The initial reference surface is either a spherical surface or a rotationally symmetric aspherical surface. The initial reference surface is established by one designating a rotationally symmetric surface that approximates the rotationally asymmetric mirror surface. The initial reference surface represents a starting point for an optimization algorithm. Once the initial reference surface is established, a local distance, $b_i$ (i=1 ... N) between a number of points of the initial reference surface and points on the surface of the rotationally asymmetric surface footprint measured along the z'-axis of the local coordinate system are determined. Next, the rotationally symmetric reference surface (surface 211 in FIG. 2B) is established by determining a minimal value for the local distances ($d_i$) using a number fitting parameters and a fitting algorithm. In the event that the rotationally symmetric reference surface is a spherical surface, the parameters include the location of the center of the sphere within the local coordinate system, the radius, of the reference surface. In FIG. 2B, decentering of the sphere center from the coordinate system origin is shown by coordinates $x_c$ and $z_c$ (decentration along the y'-axis by an amount $y_c$ is not shown in FIG. 2B). The radius of the spherical surface is designated as R. The parameters R, $x_c$, $y_c$ and $z_c$ are optimized to provide a minimal value for the local distances, $d_i$, based on the equation:

$$z'=(R^2-(x'-x_c)^2-(y'-y_c)^2)^{1/2}-z_c,$$

which is the equation for a spherical surface of radius R, centered at coordinate ($x_c$, $y_c$, $z_c$).

Where the rotationally symmetric reference surface is an aspherical surface, the parameters can include decentration and tilt of the reference surface, base radius, conical constant and aspherical coefficients. These parameters can be determined based on the equation $$z' = \frac{c'h^2}{1+\sqrt{1-(1+k')c'^2h^2}} + \sum_j A'_j h^{2j},$$

which is an equation describing conic and aspheric surfaces. Here, $h^2=x'^2+y'^2$, and $A'_j$ are coefficients characterizing the deviation of the rotationally-symmetric reference surface from a conic surface. Generally, the number of aspherical coefficients, $A'_j$, used to fit the reference surface to the mirror surface can vary depending on the computational power of the system being used to calculate the surface, the time available, and the desired level of accuracy. In some embodiments, the reference surface can be calculated using aspherical coefficients up to third order. In certain embodiments, coefficients higher than third order (e.g., fourth order, sixth order) are used. For additional discussion on parameterization of conic and aspheric surfaces see, for example, the product manual for Code V, available from Optical Research Associates (Pasadena, Calif.).

In general, fitting can be performed using a variety of optimization algorithms. For example, in some embodiments, a least squares fitting algorithm, such as a damped least squares fitting algorithm, can be used. Damped least squares fitting algorithms may be performed using commercially-available optical design software, such as Code V or ZEMAX (available from Optima Research, Ltd., Stansted, United Kingdom) for example.

After the rotationally-symmetric reference surface is determined, the local distance between additional points on the mirror surface can be determined and visualized. Additional characteristics of the rotationally-symmetric reference surface can be determined. For example, a maximum deviation of the rotationally-symmetric reference surface from the rotationally-asymmetric mirror surface can be determined.

A freeform surface can, for example, have a maximum deviation from a best fit sphere of about $\lambda$ or more (e.g., about 10$\lambda$ or more, about 20$\lambda$ or more, about 50$\lambda$ or more, about 100$\lambda$ or more, about 150$\lambda$ or more, about 200$\lambda$ or more, about 500$\lambda$ or more, about 1,000$\lambda$ or more, about 10,000$\lambda$ or more, about 50,000$\lambda$ or more). A freeform surface can have a maximum deviation from a best fit rotationally symmetric asphere of about $\lambda$ or more (e.g., about 5$\lambda$ or more, about 10$\lambda$ or more, about 20$\lambda$ or more, about 50$\lambda$ or more, about 100$\lambda$ or more, about 200$\lambda$ or more, about 500$\lambda$ or more, about 1,000$\lambda$ or more, about 10,000$\lambda$ or more). In some embodiments, a freeform surface can have a maximum deviation from a best fit rotationally symmetric asphere of about 1,000$\lambda$ or less (e.g., about 900$\lambda$ or less, about 800$\lambda$ or less, about 700$\lambda$ or less, about 600$\lambda$ or less, about 500$\lambda$ or less).

In certain embodiments, freeform surfaces have a maximum deviation from a best fit sphere by 10 nm or more (e.g., about 100 nm or more, about 500 nm or more, about 1 μm or more, about 5 μm or more, about 10 μm or more, about 50 μm or more, about 100 μm or more, about 200 μm or more, about 500 μm or more, about 1,000 μm, about 2,000 μm or more, about 3,000 μm or more). Freeform surfaces can have a maximum deviation from a best fit sphere by about 10 mm or less (e.g., about 5 mm or less, about 3 mm or less, about 2 mm or less, about 1 mm or less, about 500 μm or less).

Freeform surfaces can have a maximum deviation from a best fit rotationally symmetric asphere by 10 nm or more (e.g., about 100 nm or more, about 500 nm or more, about 1 μm or more, about 5 μm or more, about 10 μm or more, about 50 μm or more, about 100 μm or more, about 200 μm or more, about 500 μm or more, about 1,000 μm). Freeform surfaces can have a maximum deviation from a best fit rotationally symmetric asphere by about 10 mm or less (e.g., about 5 mm or less, about 3 mm or less, about 2 mm or less, about 1 mm or less, about 500 μm or less).

The curvature of the mirror surfaces is characterized by a first and second mean principal curvature, which are determined at the point on each mirror surface that reflects the chief ray of the central field point. First and second principal curvatures are calculated as described in *Handbook of Mathematics* by I. N. Bronstein, et al., 4th Ed. (Springer, 2004), p. 567. In general, the first principal curvature for a mirror can be different from the second principal curvature for that mirror. In some embodiments, the absolute value of the difference between the first and second principal curvatures can be about $10^{-8}$ or more (e.g., $10^{-7}$ or more, $5 \times 10^{-7}$ or more, about $10^{-6}$ or more, about $5\times10^{-6}$ or more, about $10^{-5}$ or more, about $5\times10^{-5}$ or more, about $10^{-4}$ or more, about $5\times10^{-4}$ or more, about $10^{-3}$ or more).

In general, the first and/or second principal curvatures can be positive or negative. The first and/or second principal curvatures for a mirror surface can be relatively small. For example, in some embodiments, the absolute value of the first principal curvature for one or more mirrors in projection objective 101 is about $10^{-2}$ or less (e.g., about $5\times10^{-3}$ or less, about $3\times10^{-3}$ or less, about $2\times10^{-3}$ or less, about $10^{-3}$ or less). The absolute value of the sum of the first principal curvatures for the mirrors in projective objective 101 can be about $10^{-3}$ or less (e.g., about $5\times10^{-4}$ or less, about $3\times10^{-4}$, about $2\times10^{-4}$ or less, about $10^{-4}$ or less, $5\times10^{-5}$ or less, $10^{-5}$ or less).

In certain embodiments, the absolute value of the second principal curvature for one or more mirrors in projection objective 101 is about $10^{-2}$ or less (e.g., about $5\times10^{-3}$ or less, about $3\times10^{-3}$ or less, about $2\times10^{-3}$ or less, about $10^{-3}$ or less). The absolute value of the sum of the second principal curvatures for the mirrors in projective objective 101 can be about $10^{-3}$ or less (e.g., about $5\times10^{-4}$ or less, about $3\times10^{-4}$, about $2\times10^{-4}$ or less, about $10^{-4}$ or less, $5\times10^{-5}$ or less, $10^{-5}$ or less).

The sum of the first and second principal curvatures of the mirrors in projection objective 101 can be relatively small. For example, the absolute value of the sum of the first and second principal curvatures of the mirrors can be about $10^{-3}$ or less (e.g., about $5\times10^{-4}$ or less, about $3\times10^{-4}$, about $2\times10^{-4}$ or less, about $10^{-4}$ or less, $5\times10^{-5}$ or less, $10^{-5}$ or less).

In certain embodiments, freeform mirror surfaces can be described mathematically by the equation:

$$Z = \frac{cr^2}{1+\sqrt{1-(1+k)c^2r^2}} + \sum_{j=2}^{66} C_j X^m Y^n$$

where $$j = \frac{(m+n)^2 + m + 3n}{2} + 1$$

and Z is the sag of the surface parallel to a Z-axis (which may or may not be parallel to the reference axis 105 in projection objective 101, i.e. in general is decentered and tilted to the reference axis 105 in projection objective 101), c is a constant corresponding to the vertex curvature, k is a conic constant, and $C_j$ is the coefficient of the monomial $X^m Y^n$. Typically, the values of c, k, and $C_j$ are determined based on the desired optical properties of the mirror with respect to projection objective 101. Further, the order of the monomial, m+n, can vary as desired. Generally, a higher order monomial can provide a projection objective design with a higher level of aberration correction, however, higher order monomials are typically more computationally expensive to determine. In some embodiments, m+n is 10 or more (e.g., 15 or more, 20 or more). As discussed below, the parameters for the freeform mirror equation can be determined using commercially-available optical design software. In some embodiments, m+n is less than 10 (e.g., 9 or less, 8 or less, 7 or less, 6 or less, 5 or less, 4 or less, 3 or less).

In general, freeform surfaces can be described mathematically using equations other than those presented above. For example, in some embodiments, freeform surfaces can be described mathematically using Zernike polynomials (such as presented in the manual for CODE V®, commercially available from Optical Research Associates, Pasadena, Calif.) or using two-dimensional spline surfaces. Examples of two-dimensional spline surfaces are Bezier splines or non-uniform rational Bezier splines (NURBS). Two-dimensional spline surfaces can be described, for example, by a grid of points in an x-y plane and corresponding z-values or slopes and these points. Depending on the specific type of spline surface, the complete surface is obtained by a specific interpolation between the grid points using, e.g., polynomials or functions that have certain properties with respect to continuity or differentiability (e.g., analytical functions).

In general, the number and position of freeform mirrors in projection objective 101 can vary. Embodiments include projection objectives with two or more freeform mirrors (e.g., three or more freeform mirrors, four or more freeform mirrors, five or more free-form mirrors, six or more freeform mirrors).

Projection objective 101 generally includes one or more mirrors with positive optical power. In other words, the reflective portion of the mirror has a concave surface and is referred to as a concave mirror. Projection objective 101 can include two or more (e.g., three or more, four or more, five or more, six or more) concave mirrors. Projection objective 101 can also include one or more mirrors that have negative optical power. This means that one or more of the mirrors has a reflective portion with a convex surface (referred to as a convex mirror). In some embodiments, projection objective 101 includes two or more (e.g., three or more, four or more, five or more, six or more) convex mirrors.

Figure 10:
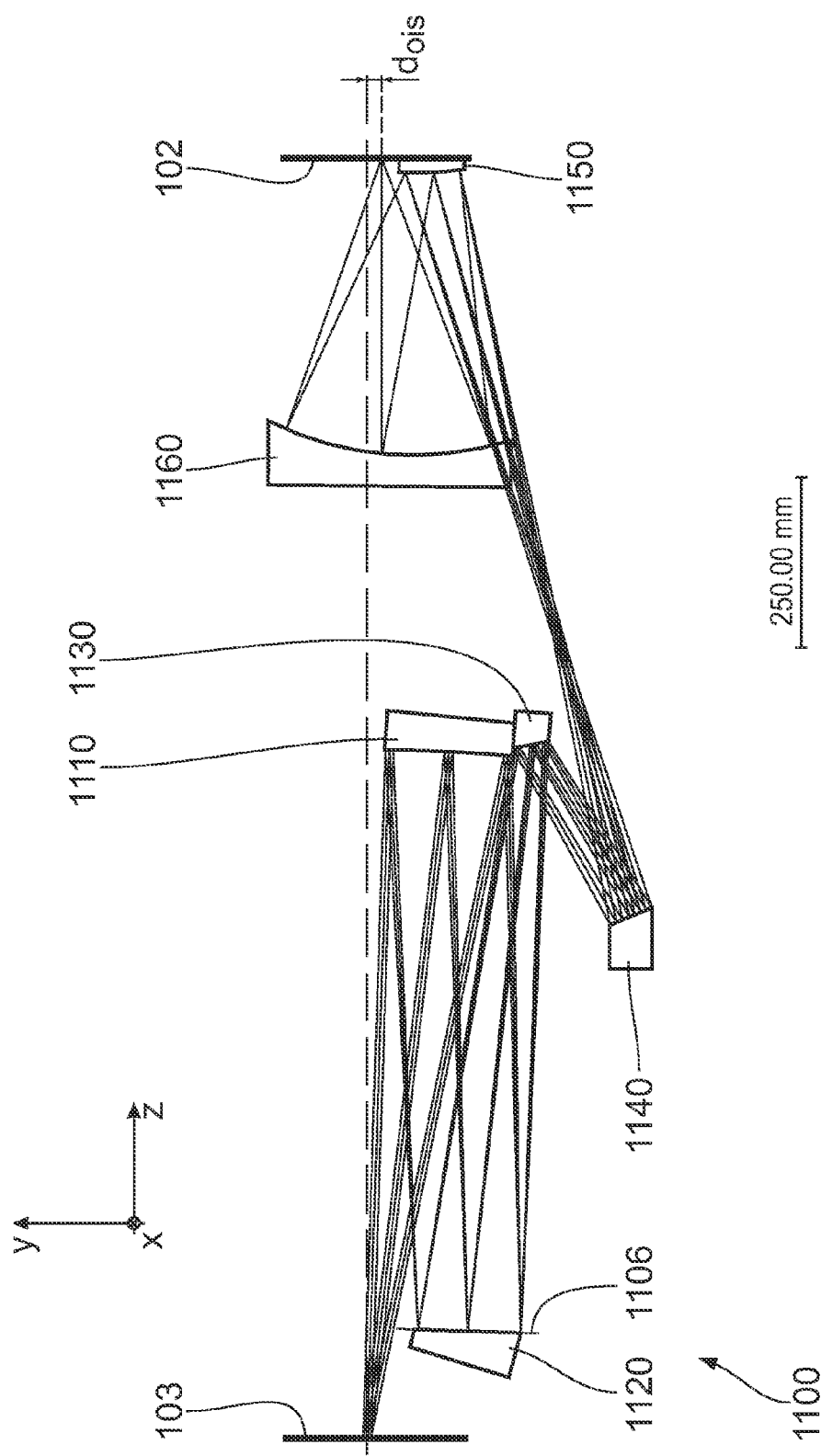
FIG. 10 is a cross-sectional view of a projection objective shown in meridional section.

Referring to FIG. 10, an embodiment of a projection objective 1100 includes six mirrors 1110, 1120, 1130, 1140, 1150, and 1160, and has an image-side numerical aperture of 0.35 and an operating wavelength of 13.5 nm. Mirrors 1110, 1120, 1130, 1140, 1150, and 1160 are all freeform mirrors. Data for projection objective 1100 is presented in Table 1A and Table 1B below. Table 1A presents optical data, while Table 1B presents free-form constants for each of the mirror surfaces. For the purposes of Table 1A and Table 1B, the mirror designations correlate as follows: mirror 1 (M1) corresponds to mirror 1110; mirror 2 (M2) corresponds to mirror 1120; mirror 3 (M3) corresponds to mirror 1130; mirror 4 (M4) corresponds to mirror 1140; mirror 5 (M5) corresponds to mirror 1150; and mirror 6 (M6) corresponds to mirror 1160. "Thickness" in Table 1A and subsequent tables refers to the distance between adjacent elements in the radiation path. The monomial coefficients, $C_j$, for the freeform mirrors, along with the amount the mirror is decentered and rotated (or tilted) from an initial projection objective design, are provided in Table 1B. R, the radius, is the inverse of the vertex curvature, c. Decenter is given in mm and rotation is given in degrees. Units for the monomial coefficients are $mm^{-j+1}$. Nradius is a unitless scaling factor (see, for example, the manual for CODE V®).

In FIG. 10, projection objective 1100 is shown in meridional section. The meridional plane is a symmetry plane for projection objective 1100. Symmetry about the meridional plane is as the mirrors are decentered only with respect to the y-axis and tilted about the x-axis. Further, the coefficients for the freeform mirrors having an odd degree in the x-coordinate (e.g., x, $x^3$, $x^5$, etc.) are zero.

Projection objective 1100 images radiation from object plane 103 to image plane 102 with a demagnification ratio of 4×. The tracklength of projection objective 1100 is 2000 mm and the optical path length of imaged radiation is 5337 mm. Accordingly, the ratio of the optical path length to tracklength is approximately 2.67. Projection objective 1100 has an aperture stop 1106 positioned at mirror 1120.

The entrance pupil of projection objective 1100 is located at infinity. The chief ray angle of the central field point at object plane 103 is 7°. The maximum variation of chief ray angles at object plane 103 is less than 0.06°. Projection objective 1100 is telecentric on the object side.

Projection objective 1100 has a rectangular field. The image-side field width, $d_x$, is 26 mm. The image-side field length, $d_y$, is 2 mm. Projection objective 1100 has an object-image shift of 31 mm.

The performance of projection objective 1100 includes an image-side $W_{rms}$ of 0.025λ. Image-side field curvature is 10 nm. Projection objective 1100 provides an intermediate image between mirrors 1140 and 1150.

The optical power of the mirrors in the order of the radiation path from object plane 103 to image plane 102 is as follows: mirror 1110 has positive optical power; mirror 1120 has positive optical power; mirror 1130 has negative optical power; mirror 1140 has positive optical power; mirror 1150 has negative optical power; and mirror 1160 has positive optical power.

The dimension of the footprint of each mirror, given as $M_x \times M_y$, is as follows: 291 mm×195 mm for mirror 1110; 159 mm×152 mm for mirror 1120; 157 mm×53 mm for mirror 1130; 295 mm×66 mm for mirror 1140; 105 mm×86 mm for mirror 1150; and 345 mm×318 mm for mirror 1160.

The chief ray angle of incidence for the central field point is 4.38°, 4.03°, 18.37°, 7.74°, 12.64°, and 5.17° for mirrors 1110, 1120, 1130, 1140, 1150, and 1160, respectively. The maximum angle of incidence, $\theta_{max}$, on each mirror for the meridional section is 6.48°, 6.44°, 20.05°, 9.12°, 21.76°, and 7.22° for mirrors 1110, 1120, 1130, 1140, 1150, and 1160, respectively. Δθ for mirrors 1110, 1120, 1130, 1140, 1150, and 1160 are 4.27°, 4.92°, 4.09°, 3.12°, 19.37°, and 4.61°, respectively.

Mirrors 1110, 1150, and 1160 have freeboards that are more than 5 mm and less than 25 mm. Mirror 1140 has positive chief ray angle magnification while mirrors 1110, 1120, 1130, and 1150 have negative chief ray angle magnification.

The image-side free working distance of projection objective 1100 is 25 mm. The object-side free working distance is 163 mm.

In projection objective 1100, $d_{op-1}/d_{op-2}$ is 6.57. Furthermore, adjacent mirror pair 1040 and 1050 are separated by more than 50% of the projection objective's tracklength. Further, the distance between mirror 1110 and object plane 103 is more than 50% of the projection objective's tracklength.

Data for projection objective 1100 is presented in Table 1A and Table 1B below. Table 1A presents optical data, while Table 1B presents aspherical constants for each of the mirror surfaces. For the purposes of Table 1A and Table 1B, the mirror designations correlate as follows: mirror 1 (M1) corresponds to mirror 1110; mirror 2 (M2) corresponds to mirror 1120; mirror 3 (M3) corresponds to mirror 1130; mirror 4 (M4) corresponds to mirror 1140; mirror 5 (M5) corresponds to mirror 1150; and mirror 6 (M6) corresponds to mirror 1160.

TABLE 1A

| Surface | Radius (mm) | Thickness (mm) | Mode |
|---|---|---|---|
| Object | INFINITY | 1070.002 | |
| Mirror 1 | −2069.710 | −907.121 | REFL |
| Mirror 2 | 1710.596 | 0.000 | REFL |
| STOP | INFINITY | 907.500 | |
| Mirror 3 | 414.111 | −319.107 | REFL |
| Mirror 4 | 618.022 | 1223.709 | REFL |
| Mirror 5 | 406.139 | −436.552 | REFL |
| Mirror 6 | 522.609 | 461.570 | REFL |
| Image | INFINITY | 0.000 | |

TABLE 1B

| Coefficient | M1 | M2 | M3 | M4 | M5 | M6 |
|---|---|---|---|---|---|---|
| K | −2.012543E+00 | −7.790981E+00 | −9.061196E−01 | −4.714699E−01 | 5.253415E+00 | 1.051556E−01 |
| Y | −1.801229E−01 | −2.676895E−01 | 6.249715E−03 | 2.914352E−02 | 3.699848E−02 | 6.762162E−04 |
| $X^2$ | −3.718177E−05 | −1.568640E−04 | −4.213586E−04 | −1.680785E−04 | −6.132874E−05 | 2.479745E−06 |
| $Y^2$ | −5.757281E−05 | −1.359112E−04 | −3.015850E−04 | −9.908817E−05 | −6.383717E−05 | 1.909227E−06 |
| $X^2Y$ | −3.283304E−08 | −1.421641E−07 | −4.802304E−08 | −4.234719E−08 | 5.460366E−07 | −5.398408E−09 |
| $Y^3$ | −7.289267E−08 | −9.447144E−08 | 3.714670E−07 | 1.405667E−07 | 2.644773E−07 | −4.741511E−09 |
| $X^4$ | −3.792148E−11 | 2.173390E−10 | −8.723035E−10 | −2.377992E−11 | 1.030821E−09 | −1.926536E−11 |
| $X^2Y^2$ | −1.087876E−10 | 5.689855E−10 | −5.959943E−10 | −4.401654E−10 | 2.045233E−09 | −4.586698E−11 |
| $Y^4$ | −1.237594E−10 | 2.990476E−10 | 8.549602E−10 | −4.022663E−11 | 5.551510E−11 | −2.632066E−11 |
| $X^4Y$ | −3.587007E−14 | −1.028868E−12 | −8.033093E−12 | 1.716353E−13 | 5.551826E−12 | −2.577816E−14 |
| $X^2Y^3$ | 8.925822E−14 | 4.492952E−13 | −1.186636E−12 | −7.545064E−13 | −4.309344E−12 | −1.775797E−14 |
| $Y^5$ | −7.423435E−14 | 5.791519E−13 | 8.705928E−14 | −2.700779E−13 | −7.302230E−12 | −9.309635E−15 |
| $X^6$ | 1.876838E−17 | 2.916278E−16 | −2.307341E−14 | −1.670466E−15 | 8.878140E−15 | −3.351380E−17 |
| $X^4Y^2$ | −3.009967E−16 | −3.620666E−16 | −2.232847E−14 | 1.589023E−15 | 4.463758E−14 | −1.408427E−16 |
| $X^2Y^4$ | 1.992400E−16 | 3.916129E−16 | 1.756497E−15 | 3.477633E−16 | 1.478648E−13 | −1.372823E−16 |
| $Y^6$ | 8.315953E−18 | −6.580116E−16 | 8.232062E−16 | 1.253553E−16 | 3.691569E−14 | −3.799352E−17 |
| $X^6Y$ | −2.621825E−20 | −1.237101E−17 | −3.125465E−16 | −7.682746E−18 | 3.293829E−16 | −1.214309E−19 |
| $X^4Y^3$ | −1.344388E−18 | 3.730815E−17 | 1.376670E−16 | 5.918289E−18 | 8.409538E−16 | 5.369262E−20 |
| $X^2Y^5$ | −6.157858E−19 | 3.202677E−17 | 4.387074E−19 | 2.707480E−18 | 4.875870E−16 | −1.363873E−20 |
| $Y^7$ | 2.770009E−20 | 8.487049E−18 | 2.518948E−18 | 1.820744E−19 | 1.274511E−16 | 2.776746E−21 |
| $X^8$ | 2.265356E−23 | −1.881878E−20 | 6.916970E−19 | 3.815768E−20 | −1.030207E−19 | −2.085793E−23 |
| $X^6Y^2$ | −1.848041E−22 | −1.667898E−19 | −1.070800E−18 | 1.947584E−20 | −6.071205E−19 | −1.191227E−22 |
| $X^4Y^4$ | −1.617091E−21 | −4.471313E−20 | −2.039154E−19 | −1.469302E−21 | 8.581801E−18 | −2.848570E−22 |
| $X^2Y^6$ | −1.152811E−21 | −1.417078E−19 | −4.885470E−20 | 8.329380E−22 | 2.867618E−18 | 8.073429E−24 |
| $Y^8$ | 5.021474E−23 | −1.270497E−20 | −2.834042E−20 | −1.011971E−21 | 1.813992E−18 | −6.757839E−23 |
| $X^8Y$ | 0.000000E+00 | 0.000000E+00 | 7.973679E−21 | 2.492982E−22 | 0.000000E+00 | −2.465296E−25 |
| $X^6Y^3$ | 0.000000E+00 | 0.000000E+00 | 7.629111E−22 | 1.401277E−22 | 0.000000E+00 | 2.930653E−25 |
| $X^4Y^5$ | 0.000000E+00 | 0.000000E+00 | −7.196032E−21 | −4.219890E−23 | 0.000000E+00 | 1.194933E−25 |
| $X^2Y^7$ | 0.000000E+00 | 0.000000E+00 | −1.090375E−22 | −3.791571E−24 | 0.000000E+00 | 5.412579E−25 |
| $Y^9$ | 0.000000E+00 | 0.000000E+00 | −5.080252E−23 | 1.076602E−24 | 0.000000E+00 | 3.891280E−26 |
| $X^{10}$ | 0.000000E+00 | 0.000000E+00 | −6.129418E−25 | −1.289913E−27 | 0.000000E+00 | 0.000000E+00 |
| $X^8Y^2$ | 0.000000E+00 | 0.000000E+00 | 2.295090E−23 | 4.078311E−25 | 0.000000E+00 | 0.000000E+00 |

TABLE 1B-continued

| Coefficient | M1 | M2 | M3 | M4 | M5 | M6 |
|---|---|---|---|---|---|---|
| $X^6Y^4$ | 0.000000E+00 | 0.000000E+00 | 5.951785E−24 | 1.728297E−25 | 0.000000E+00 | 0.000000E+00 |
| $X^4Y^6$ | 0.000000E+00 | 0.000000E+00 | −1.732732E−23 | −5.280557E−26 | 0.000000E+00 | 0.000000E+00 |
| $X^2Y^8$ | 0.000000E+00 | 0.000000E+00 | 0.000000E+00 | −1.410994E−27 | 0.000000E+00 | 0.000000E+00 |
| $Y^{10}$ | 0.000000E+00 | 0.000000E+00 | 0.000000E+00 | 3.484416E−27 | 0.000000E+00 | 0.000000E+00 |
| Nradius | 1.000000E+00 | 1.000000E+00 | 1.000000E+00 | 1.000000E+00 | 1.000000E+00 | 1.000000E+00 |
| Y-decenter | 194.936 | −49.734 | 36.609 | 9.442 | 30.019 | 40.956 |
| X-rotation | −5.944 | −17.277 | −5.569 | −0.579 | 0.301 | −0.924 |

In certain embodiments, the arrangement of mirrors in projection objective 101 images radiation from object plane 103 to one or more intermediate-image planes. Embodiments that have one or more intermediate images, also include two or more pupil planes. In some embodiments, at least one of these pupil planes is physically accessible for the purposes of placing an aperture stop substantially at that pupil plane. An aperture stop is used to define the size of the projection objective's aperture.

Coma at an intermediate image in projection objective 101 can be relatively large. Coma can be quantified by the distance between the chief ray and the upper and lower rays at the point where the upper and lower rays cross. In some embodiments, this distance can be about 1 mm or more (e.g., about 2 mm or more, about 3 mm or more, about 4 mm or more, about 5 mm or more, about 6 mm or more, such as about 7 mm). Coma at an intermediate image in projection objective can be relatively small. In some embodiments, the distance can be about 1 mm or less (e.g., about 0.1 mm or less, 0.01 mm or less).

In general, mirrors in projection objective 101 are formed so that they reflect a substantial amount of radiation of wavelength λ normally-incident thereon or incident thereon over a certain range of incident angles. Mirrors can be formed, for example, so that they reflect about 50% or more (e.g., about 60% or more, about 70% or more, about 80% or more, about 90% or more, about 95% or more, 98% or more) of normally incident radiation at λ.

In some embodiments, the mirrors include a multilayer stack of films of different materials arranged to substantially reflect normally incident radiation at λ. Each film in the stack can have an optical thickness of about λ/4. Multilayer stacks can include about 20 or more (e.g., about 30 or more, about 40 or more, about 50 or more) films. In general, the materials used to form the multilayer stacks are selected based on operational wavelength λ. For example, multiple alternating films of molybdenum and silicon or molybdenum and beryllium can be used to form mirrors for reflecting radiation in the 10 nm to 30 nm range (e.g., for λ of about 13 nm or about 11 nm, respectively). Generally, multiple alternating films of molybdenum and silicon can be used for λ=11 nm and multiple alternating films of molybdenum and beryllium can be used for λ=13 nm.

In certain embodiments, the mirrors are made of quartz glass coated with a single layer of aluminum and overcoated with one or more layers of dielectric materials, such as layers formed from $MgF_2$, $LaF_2$, or, $Al_2O_3$ Mirrors formed from aluminum with dielectric coatings can be used, for example, for radiation having a wavelength of about 193 nm.

Figure 3:
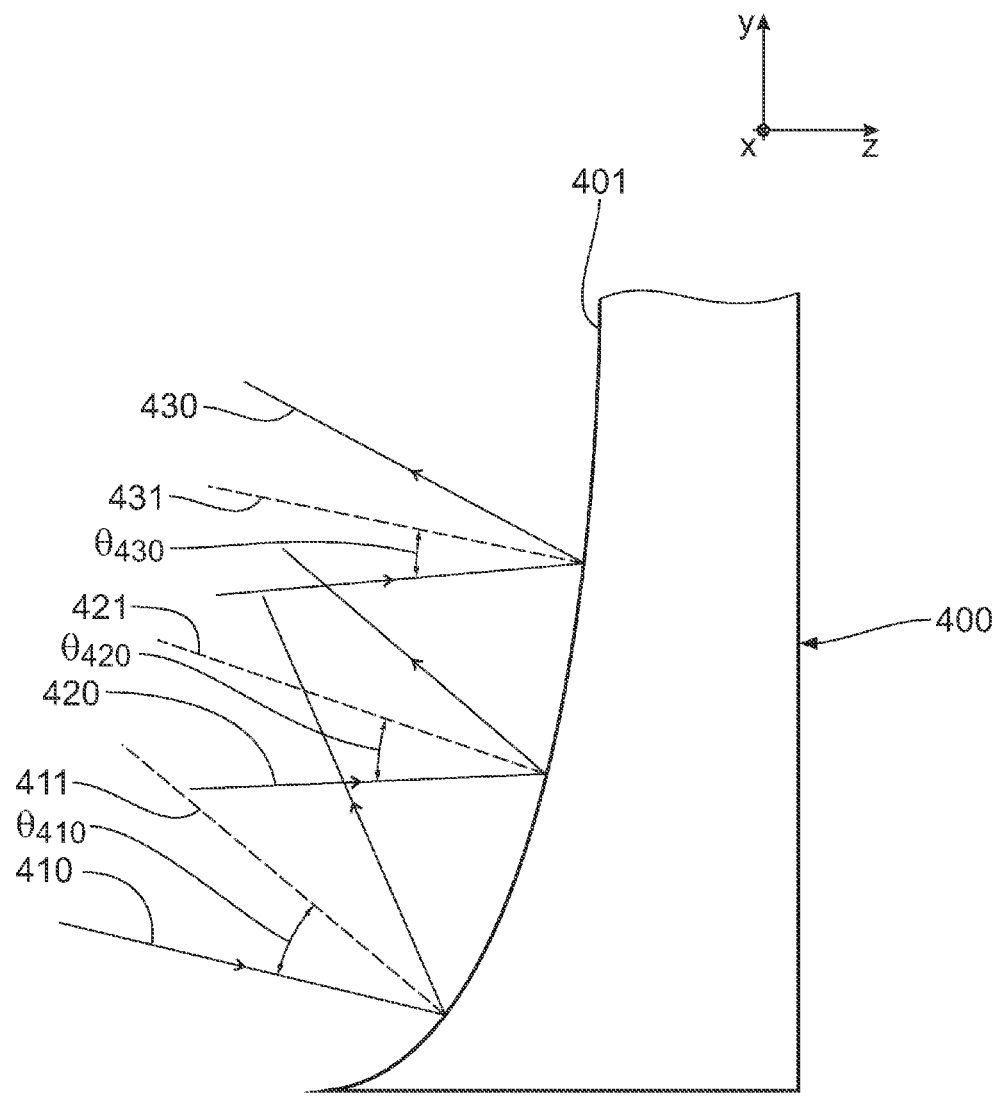
FIG. 3 is a cross-sectional view of a portion of a mirror from a projection objective shown in meridional section.

In general, the percentage of radiation at λ reflected by a mirror varies as a function of the angle of incidence of the radiation on the mirror surface. Because imaged radiation propagates through a catoptric projection objective along a number of different paths, the angle of incidence of the radiation on each mirror can vary. This effect is illustrated with reference to FIG. 3, which shows a portion of a mirror 400, in meridional section, that includes a concave reflective surface 401. Imaged radiation is incident on surface 401 along a number of different paths, including the paths shown by rays 410, 420, and 430. Rays 410, 420, and 430 are incident on portions of surface 401 where the surface normal is different. The direction of surface normal at these portions is shown by lines 411, 421, and 431, corresponding to rays 410, 420, and 430, respectively. Rays 410, 420, and 430 are incident on surface 401 at angles $\theta_{410}$, $\theta_{420}$, and $\theta_{430}$, respectively. In general, angles $\theta_{410}$, $\theta_{420}$, and $\theta_{430}$ may vary.

For each mirror in projection objective 101, the incident angles of imaged radiation can be characterized in a variety of ways. One characterization is the maximum angle of incidence of meridional rays on each mirror in a meridional section of projection objective 101. Meridional rays refer to rays lying in the meridional section. In general, $\theta_{max}$ can vary for different mirrors in projection objective 101.

In some embodiments, the maximum value of $\theta_{max}$ for all the mirrors in projection objective 101 is about 75° or less (e.g., about 70° or less, about 65° or less, about 60° or less, about 55° or less, about 50° or less, about 45° or less). $\theta_{max}$ can be more than about 5° (e.g., about 10° or more, about 20° or more). In some embodiments, the maximum value of $\theta_{max}$ can be relatively low. For example, the maximum value of $\theta_{max}$ can be about 40° or less (e.g., about 35° or less, about 30° or less, about 25° or less, about 20° or less, about 15° or less, about 13° or less, about 10° or less).

In some embodiments, the ratio of the maximum value of $\theta_{max}$ (in degrees) to image-side NA can be about 10° or less (e.g., about 8° or less, about 7° or less, 68 or less, about 60 or less, about 5° or less, about 4° or less, about 3° or less).

Another characterization is the angle of incidence of the chief ray corresponding to the central field point on each mirror in a meridional section of projection objective 101. This angle is referred to as $\theta_{CR}$. In general, $\theta_{CR}$ can vary. In some embodiments the maximum value of θdCR, $\theta_{CR}(max)$, in projection objective 101 can be relatively low. For example, $\theta_{CR}(max)$ can be about 35° or less (e.g., about 30° or less, about 25° or less, about 20° or less, about 15° or less, about 13° or less, about 10° or less, about 8° or less, about 5° or less).

In some embodiments, the ratio of the maximum value of $\theta_{CR(max)}$ (in degrees) to image-side NA can be about 10° or less (e.g., about 8° or less, about 7° or less, 68 or less, about 6° or less, about 5° or less, about 4° or less, about 3° or less).

Each mirror in projection objective 101 can also be characterized by the range of angles of incidence, Δθ, of rays for a meridional section of projection objective 101. For each mirror, Δθ corresponds to the difference between $\theta_{max}$ and $\theta_{min}$, where $\theta_{min}$ is the minimum angle of incidence of rays on each mirror in a meridional section of projection objective 101. In general, Δθ may vary for each mirror in projection objective 101. For some mirrors, Δθ can be relatively small.

For example, Δθ can be about 20° or less (e.g., about 15° or less, about 12° or less, about 10° or less, about 8° or less, about 5° or less, about 3° or less, 2° or less). Alternatively, for some mirrors in projection objective 101, Δθ can be relatively large. For example, Δθ for some mirrors can be about 20° or more (e.g., about 25° or more, about 30° or more, about 35° or more, about 40° or more).

In some embodiments, the maximum value for Δθ, $\Delta\theta_{max}$, for all the mirrors in projection objective 101 can be relatively small. For example, $\Delta\theta_{max}$ can be about 25° or less (e.g., about 20° or less, about 15° or less, about 12° or less, about 10° or less, about 9° or less, about 8° or less, about 7° or less, about 6° or less, about 5° or less, such as 3°).

Figure 4:
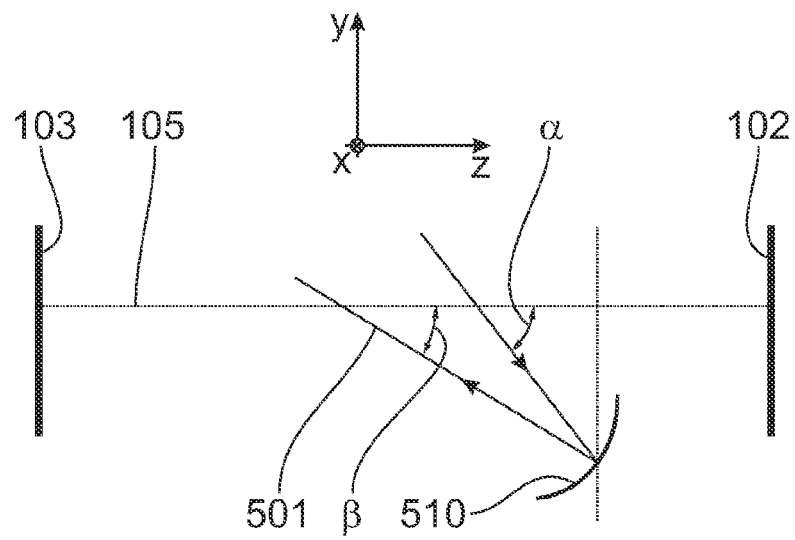
FIG. 4 is a schematic view of a ray path at a mirror having a positive chief ray angle magnification.
Figure 5:
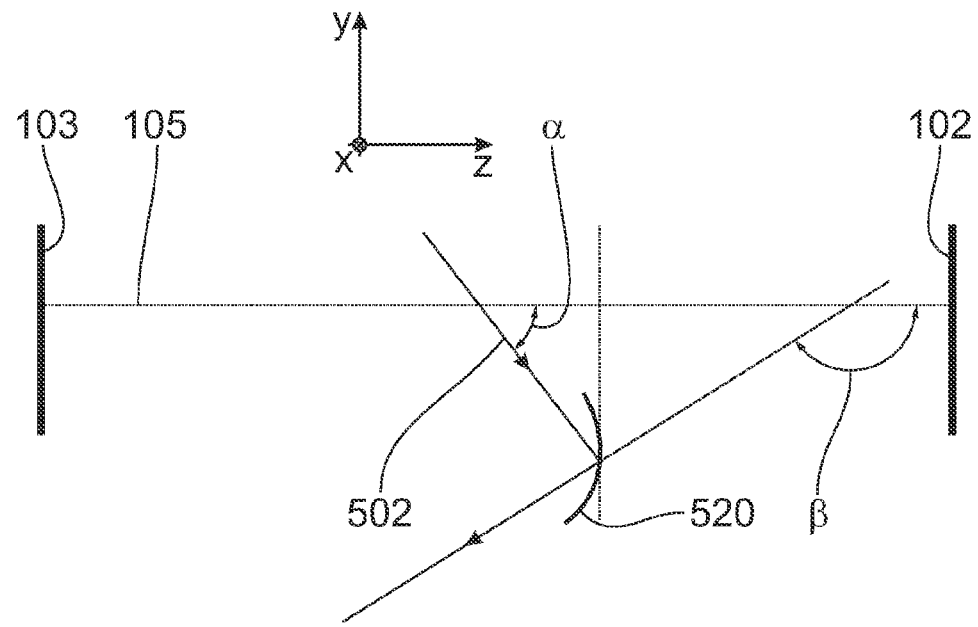
FIG. 5 is a schematic view of a ray path at a mirror having a negative chief ray angle magnification.

Another way to characterize the radiation path in projection objective 101 is by the chief ray magnification at each mirror, which refers to the quotient of the tangent of the angle between the chief ray (e.g. in the meridional section) and reference axis 105 before and after reflection from each mirror. For example, referring to FIG. 4 where a chief ray 501 diverges from reference axis 105 prior to reflection from a mirror 510, and reflects from mirror 510 back towards reference axis 105, mirror 510 has a positive chief ray angle magnification. Referring to FIG. 5, alternatively, where a chief ray 502 diverges from reference axis 105 both before and after reflection from a mirror 520, mirror 520 has a negative chief ray angle magnification. In both cases, the chief ray magnification is given by $\tan(\alpha)/\tan(\beta)$. In certain embodiments, having multiple mirrors with positive chief ray angle magnification can correspond to relatively large incident angles on one or more mirrors in the projection objective. Accordingly, projection objectives having only one mirror with positive chief ray angle magnification can also exhibit relatively low incident ray angles on the mirrors.

The relative spacing of mirrors in projection objective 101 can vary depending on the specific design of the projection objective. Relatively large distances between adjacent mirrors (with respect to the path of the radiation) can correspond to relatively low incident ray angles on the mirrors. In certain embodiments, projection objective 101 can include at least one pair of adjacent mirrors that separated by more than 50% of the projection objective tracklength.

In certain embodiments, having a large relative distance, $d_{op-1}$, between the object plane and the first mirror in the radiation path compared to the distance, $d_{op-2}$, between the object plane and the second mirror in the radiation path can also correspond to relatively low incident ray angles on the mirrors. For example, embodiments where $d_{op-1}/d_{op-2}$ is about 2 or more (e.g., about 2.5 or more, about 3 or more, about 3.5 or more, about 4 or more, about 4.5 or more, about 5 or more) can also have relatively low incident ray angles.

In general, the footprint size and shape of the mirrors in projection objective 101 can vary. The footprint shape refers to the shape of the mirror projected onto the x-y plane. The footprint of the mirrors can be circular, oval, polygonal (e.g., rectangular, square, hexagonal), or irregular in shape. In embodiments, the footprint is symmetric with respect to the meridional plane of projection objective 101.

In certain embodiments, mirrors can have a footprint with a maximum dimension that is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less.) Mirrors may have footprint that has a maximum dimension that is more than about 10 mm (e.g., about 20 mm or more, about 50 mm or more).

Figure 6B:
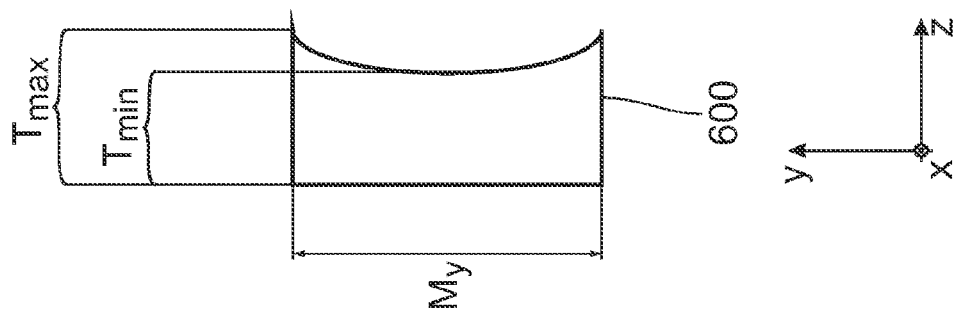
FIG. 6B is a cross-section view of the mirror shown in FIG. 6A.
Figure 6A:
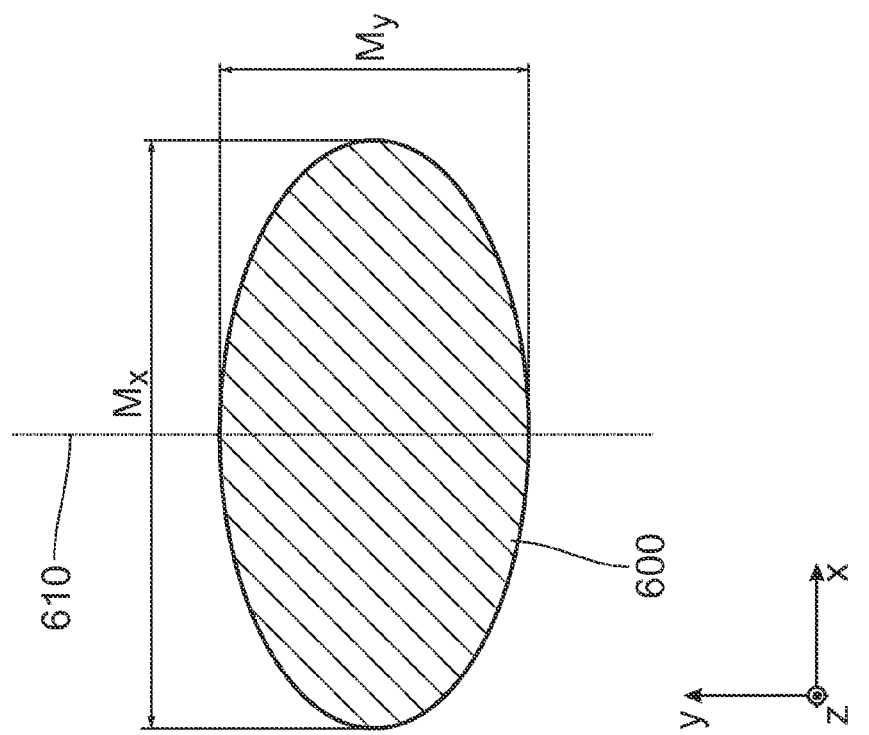
FIG. 6A is a view of a mirror's footprint.

An example of a mirror 600 with an oval footprint is shown in FIG. 6A. Mirror 600 has a maximum dimension in the x-direction given by $M_x$. In embodiments, $M_x$ can be about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, about 400 mm or less, about 300 mm or less, about 200 mm or less, about 100 mm or less). $M_x$ can be more than about 10 mm (e.g., about 20 mm or more, about 50 mm or more).

Mirror 600 is symmetric with respect to meridian 601. Mirror 600 has a dimension $M_y$ along meridian 601. For mirror 600 $M_y$ is smaller than $M_x$, however, more generally, $M_y$ can be smaller, the same size, or larger than $M_x$. In some embodiments, $M_y$ is in a range from about 0.1 $M_x$ to about $M_x$ (e.g., about 0.2 $M_x$ or more, about 0.3 $M_x$ or more, about 0.4 $M_x$ or more, about 0.5 $M_x$ or more, about 0.6 $M_x$ or more, about 0.7 $M_x$ or more about 0.8 $M_x$ or more, about 0.9 $M_x$ or more). Alternatively, in certain embodiments, $M_y$ can be about 1.1 $M_x$ or more (e.g., about 1.5 $M_x$ or more), such as in a range from about 2 $M_x$ to about 10 $M_x$. $M_y$ can be about 1,000 mm or less (e.g., about 900 mm or less, about 800 mm or less, about 700 mm or less, about 600 mm or less, about 500 mm or less, about 400 mm or less, about 300 mm or less, about 200 mm or less, about 100 mm or less). $M_y$ can be more than about 10 mm (e.g., about 20 mm or more, about 50 mm or more).

In some embodiments, the base of the mirrors may extend beyond the mirror surface (i.e., the portion of the mirror that reflects imaged radiation) in one or more directions. For example, a mirror's base can extend about 10 mm or more (e.g., about 20 mm or more, about 30 mm or more, about 40 mm or more, about 50 mm or more) beyond the optically active surface in the x- and/or y-directions. Mirror base extension can facilitate mounting the mirror in projection objective 101 by providing surfaces that are not optically active that can be attached to mounting apparatus.

Optionally, mirror base extensions should not be in a direction that occludes the radiation path in projection objective 101. The distance between the edge of a mirror and the radiation path as it passes the mirror is related to a parameter referred to as the "freeboard," which is the minimum distance between the rays closest to a mirror's edge and the rays nearest the mirror's edge that are reflected by the mirror. In some embodiments, projection objective 101 can include one or more mirrors with freeboards of about 20 mm or more (e.g., about 25 mm or more, about 30 mm or more, about 35 mm or more, about 40 mm or more, about 45 mm or more, about 50 mm or more). Large freeboards provide flexibility in mirror fabrication as the projection objective can accommodate an extended mirror base without occlusion of the imaged radiation. However, relatively small freeboards can correspond to low incident ray angles on the mirrors in the projection objective. In some embodiments, projection objective 101 can include one or more mirrors with freeboards of about 15 mm or less (e.g., about 12 mm or less, about 10 mm or less, about 8 mm or less, about 5 mm or less). In certain embodiments, projection objective 101 includes one or more mirrors having a freeboard between 5 mm and 25 mm.

In general, the thickness of the mirrors in projection objective 101 may vary. Mirror thickness refers to the dimension of the mirror along the z-axis. Mirrors should generally have sufficient thickness to facilitate mounting within the projection objective. Referring to FIG. 6B, the thickness of mirror 600 can be characterized by a maximum thickness, $T_{max}$, and a minimum thickness, $T_{min}$. Typically, the difference between $T_{max}$ and $T_{min}$ will depend on the curvature of the mirror surface and the structure of the mirror's base. In some embodiments, $T_{max}$ is about 200 mm or less (e.g., about 150 mm or less, about 100 mm or less, about 80 mm or less, about 60 mm or less, about 50 mm or less, about 40 mm or less, about 30 mm or less, about 20 mm or less). In certain embodiments, $T_{min}$ is about 1 mm or more (e.g., about 2 mm or more, about 5 mm or more, about 10 mm or more, about 20 mm or more, about 50 mm or more, about 100 mm or more).

In some embodiments, the maximum dimension of any mirror in projection objective is about 1,500 mm or less (e.g., about 1,400 nm or less, about 1,300 mm or less, about 1,200 mm or less, about 1,100 mm or less, about 1,000 mm or less, about 900 mm or less, about 800 mm or less, about 700 mm or less, about 600 mm or less, about 500 mm or less, such as about 300 mm). In certain embodiments, the maximum dimension of any mirror in projection objective is about 10 mm or more (e.g., about 20 mm or more, about 30 mm or more, about 40 mm or more, about 50 mm or more, about 75 mm or more, about 100 mm or more).

In general, the shape of the field of projection objective 101 can vary. In some embodiments, the field has an arcuate shape, such as the shape of a segment of a ring. Referring to FIG. 7A, a ring-segment field 700 can be characterized by an x-dimension, $d_x$, a y-dimension, $d_y$, and a radial dimension, $d_r$. $d_x$ and $d_y$ correspond to the dimension of the field along the x-direction and y-direction, respectively. $d_r$ corresponds to the ring radius, as measured from an axis 705 to the inner boundary of field 700. It should be stressed that the axis 705 is no axis to describe the optical system (e.g. it is not the reference axis) and in particular is not an optical axis. Axis 705 only serves to define the ring-segment field 700. Ring-segment field 700 is symmetric with respect to a plane parallel to the y-z plane and indicated by line 710. In general, the sizes of $d_x$, $d_y$, and $d_r$ vary depending on the design of projection objective 101. Typically $d_y$ is smaller than $d_x$. The relative sizes of field dimensions $d_x$, $d_y$, and $d_r$ at object plane 103 and image plane 102 vary depending on the magnification or demagnification of projection objective 101.

In some embodiments, $d_x$ is relatively large at image plane 102. For example, $d_x$ at image plane 102 can be more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more). $d_x$ can be about 100 mm or less (e.g., about 50 mm or less, about 30 mm or less). $d_y$ at image plane 102 can be in a range from about 0.5 mm to about 5 mm (e.g., about 1 mm, about 2 mm, about 3 mm, about 4 mm).

Typically, $d_r$ at image plane 102 is about 10 mm or more. $d_r$ can be, for example, about 15 mm or more (e.g., about 20 mm or more, about 25 mm or more, about 30 mm or more) at image plane 102. In some embodiments, $d_r$ can be extremely large (e.g., about 1 m or more, about 5 m or more, about 10 m or more). In certain embodiments, the field is rectangular in shape and $d_r$ is infinite.

More generally, for other field shapes, projection objective 101 can have a maximum field dimension of more than 1 mm (e.g., about 3 mm or more, about 4 mm or more, about 5 mm or more, about 6 mm or more, about 7 mm or more, about 8 mm or more, about 9 mm or more, about 10 mm or more, about 11 mm or more, about 12 mm or more, about 13 mm or more, about 14 mm or more, about 15 mm or more, about 18 mm or more, about 20 mm or more, about 25 mm or more) at image plane 102. In certain embodiments, projection objective has a maximum field dimension of no more than about 100 mm (e.g., about 50 mm or less, about 30 mm or less).

In some embodiments, the image field shape can correspond (e.g., in one or more dimensions) to the shape of die sites on a wafer that is exposed using projection objective 101. For example, the image field can be shaped to reduce overscan when exposing the wafer. Overscan refers to the need to scan the image field beyond the edge of a die site to expose the entire site. Generally, this occurs where the shape of the image field does not conform to the shape of die site.

Overscan can be characterized by the ratio (e.g., expressed as a percentage) of the maximum distance between the leading edge of the image field and the trailing edge of the die site at the position where the corners at the trailing edge of the die site are exposed. Referring to FIG. 7B, overscan corresponds to the ratio of $d_{os}$ to $d_y$, where $d_{os}$ is the distance between the leading edge of image field 700 and the trailing edge of die sites 720 at the position where corners 721 and 722 are exposed. In certain embodiments, projection objective can have relatively low overscan. For example, projection objective can have an overscan of about 5% or less (e.g., about 4% or less, about 3% or less, about 2% or less, about 1% or less, about 0.5% or less, 0.1% or less).

In certain embodiments, projection objective 101 can be used with zero overscan. For example, referring to FIG. 7C, in embodiments where an image field 730 is used to expose square die sites 740, scanning can be achieved with zero overscan.

Figure 8:
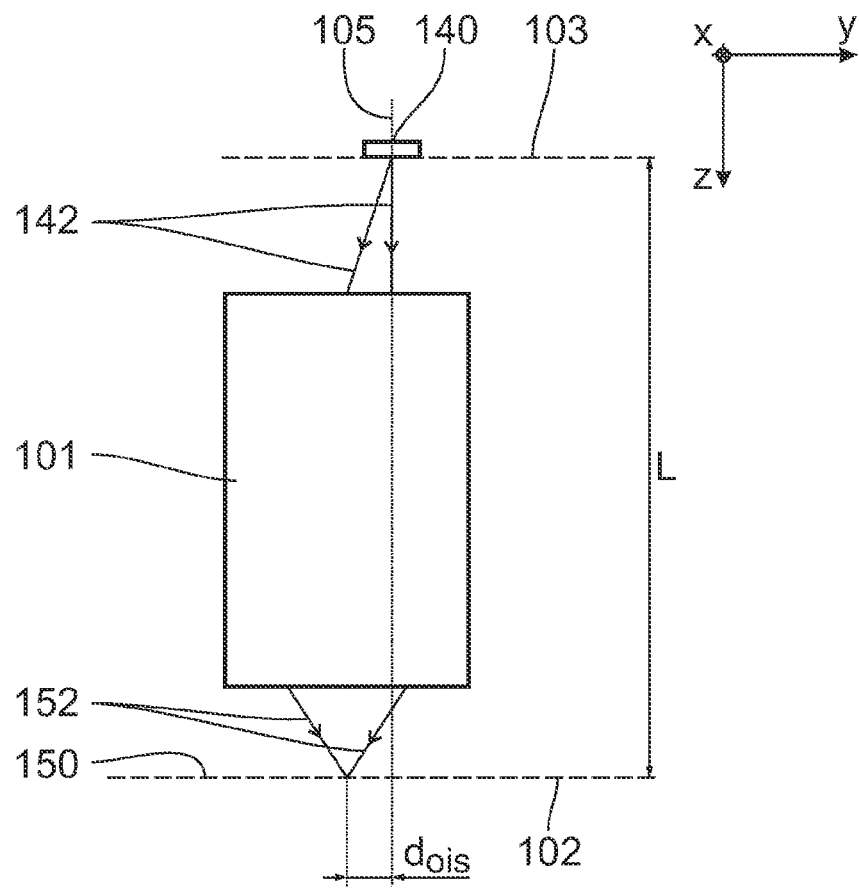
FIG. 8 is a schematic view of the projection objective of the microlithography tool shown in FIG. 1.

Referring to FIG. 8, in general, projection objective 101 introduces an object-image shift, $d_{ois}$, that varies depending on the specific design of the projection objective. The object-image shift refers to the distance of a point in the image field from the corresponding point in the object field, as measured in the x-y plane. For projection objectives that have an optical axis (a common axis of rotational symmetry for each mirror in the projection objective) the object-image shift can be calculated using the formula:

$$d_{ois}=h_o(1-M)$$

where $h_o$ refers to the distance in the x-y plane of the central field point in the object field from the optical axis and M is the projection objective magnification ratio. For example, for a projection objective have a demagnification of 4× (i.e., M=0.25) and where the central field point is 120 mm from the optical axis, $d_{ois}$ is 90 mm.

In some embodiments, projection objective 101 can have a relatively small object-image shift. For example, projection objective has zero object-image shift. Projection objectives having relatively small object image shifts can be have a relatively slim optical design. Furthermore, in embodiments that have zero object-image shift, projection objective 101 can be rotated about the axis intersecting the central field points in the object and image fields without the central field point translating with respect to, e.g., stage 130. This can be advantageous where, for example, metrology tools (e.g., detection optical systems, such as those disclosed in U.S. Pat. No. 6,240,158 B1) for inspecting and aligning wafers with respect to projection objective 101 are placed at a nominal position of the central field point because the central field point is not translated with respect to this position when the projection objective rotates. Accordingly, zero object-image shift can facilitate easier metrology and testing of projective objective 101 where the projection objective is subject to rotations during the course of operation.

In some embodiments, projection objective 101 has a $d_{ois}$ of about 80 mm or less (e.g., about 60 mm or less, about 50 mm or less, about 40 mm or less, about 30 mm or less, about 20 mm or less, about 15 mm or less, about 12 mm or less, about 10 mm or less, about 8 mm or less, about 5 mm or less, about 4 mm or less, about 3 mm or less, about 2 mm or less, about 1 mm or less).

Figure 9:
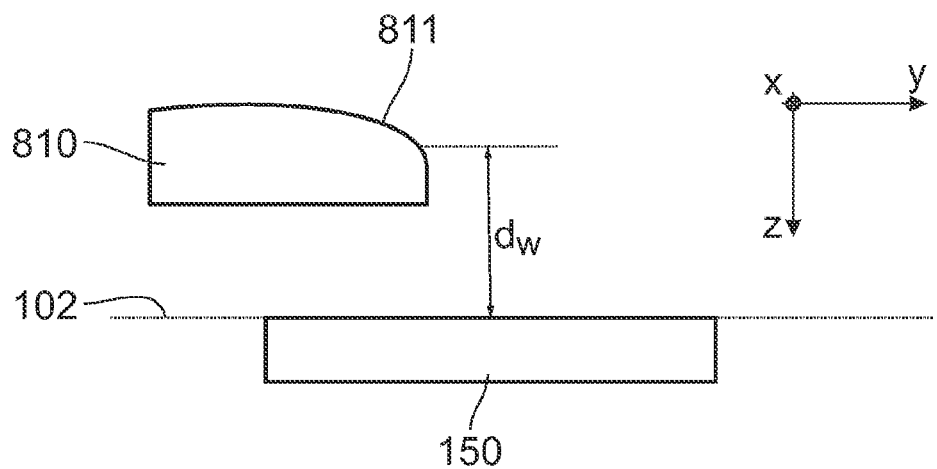
FIG. 9 is a cross-sectional view of components of a projection objective shown in meridional section.

Embodiments of projection objective 101 can have a relatively large image-side free working distance. The image-side free working distance refers to the shortest distance between image plane 102 and the mirror surface of the mirror closest to image plane 102 that reflects imaged radiation. This is illustrated in FIG. 9, which shows a mirror 810 as the closest mirror to image plane 102. Radiation reflects from surface 811 of mirror 810. The image-side free working distance is denoted $d_w$. In some embodiments, $d_w$ is about 25 mm or more (e.g., about 30 mm or more, about 35 mm or more, about 40 mm or more, about 45 mm or more, about 50 mm or more about 55 mm or more, about 60 mm or more, about 65 mm or more). In certain embodiments, $d_w$ is about 200 mm or less (e.g., about 150 mm or less, about 100 mm or less, about 50 mm or less). Projection objective 300, for example, has an image-side free working distance of approximately 45 mm. A relatively large working distance may be desirable because it can allow the surface of substrate 150 to be positioned at image plane 102 without contacting the side of mirror 810 facing image plane 102.

Analogously, the object-side free working distance refers to the shortest distance between object plane 103 and the mirror surface of the reflective side of the mirror in projection objective 101 closest to object plane 103 that reflects imaged radiation. In some embodiments, projection objective 101 has a relatively large object-side free working distance. For example, projection objective 101 can have an object-side free working distance of about 50 mm or more (e.g., about 100 mm or more, about 150 mm or more, about 200 mm or more, about 250 mm or more, about 300 mm or more, about 350 mm or more, about 400 mm or more, about 450 mm or more, about 500 mm or more, about 550 mm or more, about 600 mm or more, about 650 mm or more, about 700 mm or more, about 750 mm or more, about 800 mm or more, about 850 mm or more, about 900 mm or more, about 950 mm or more, about 1,000 mm or more). In certain embodiments, the object-side free working distance is no more than about 2,000 mm (e.g., about 1,500 mm or less, about 1,200 mm or less, about 1,000 mm or less). A relatively large object-side free working distance may be advantageous in embodiments where access to the space between projection objective 101 and object plane 103 is desired. For example, in embodiments where reticle 140 is a reflective reticle, it is desirable to illuminate the reticle from the side that faces objective 101. Therefore, there should be sufficient space between projection objective 101 and object plane 103 to allow the reticle to be illuminated by illumination system 120 at a desired illumination angle. Furthermore, in general, a larger object-side free working distance allows flexibility in design of the rest of tool, for example, by providing sufficient space to mount other components (e.g. an uniformity filter) between projection objective 101 and the support structure for reticle 140.

In general, projection objective 101 can be designed so that chief rays either converge, diverge, or are substantially parallel to each other at reticle 140. Correspondingly, the location of the entrance pupil of projection objective 101 with respect to object plane 103 can vary. For example, where chief rays converge at reticle 140, the entrance pupil is located on the image plane side of object plane 103. Conversely, where the chief rays diverge at reticle 140, object plane 103 is located between the entrance pupil and image plane 102. Furthermore, the distance between object plane 103 and the entrance pupil can vary. In some embodiments, the entrance pupil is located about 1 m or more (e.g., about 2 m or more, about 3 m or more, about 4 m or more, about 5 m or more, about 8 m or more, about 10 m or more) from object plane 103 (measured along an axis perpendicular to object plane 103). In some embodiments, the entrance pupil is located at infinity with respect to object plane 103. This corresponds to where the chief rays are parallel to each other at reticle 140.

In general, projection objective 101 can be designed using commercially available optical design software like ZEMAX, OSLO, or Code V. Typically, a design is started by specifying an initial projection objective design (e.g., arrangement of mirrors) along with parameters such as the radiation wavelength, field size and numerical aperture, for example. The code then optimizes the design for specified optical performance criteria, such as, for example, wavefront error, distortion, telecentricity, and field curvature.

In certain embodiments, the initial projection objective is designated by rotationally symmetric mirrors (e.g., spherical or aspherical mirrors) that are centered on an optical axis. Each mirror is then decentered from the optical axis to a position where the mirror satisfies some pre-established criterion. For example, each mirror can be decentered from the optical axis by and amount which minimizes the chief ray angle of incidence across the mirror for particular field. In embodiments, mirrors can be decentered by about 5 mm or more (e.g., about 10 mm or more, about 20 mm or more, about 30 mm or more, about 50 mm or more). In certain embodiments, mirrors are decentered by about 200 mm or less (e.g., about 180 mm or less, about 150 mm or less, about 120 mm or less, about 100 mm or less).

Alternatively, or additionally, each mirror can be tilted to a position where the mirror satisfies some pre-established criterion. The tilt refers to the orientation of each mirrors symmetry axis with respect to the optical axis of the initial configuration of the projection objective. Mirrors can be titled by about 1° or more (e.g., about 2° or more, about 3° or more, about 4° or more, about 5° or more). In some embodiments, mirrors are tilted by about 20° or less (e.g., about 15° or less, about 12° or less, about 10° or less).

After decentering and/or tilting, a freeform shape for each mirror can be determined to optimize the projection objective design for specified optical performance criteria.

In addition to mirrors, projection objective 101 can include one or more other components, such as one or more aperture stops. In general, the shape of the aperture stop can vary. Examples of aperture stops include circular aperture stops, elliptical aperture stops, and/or polygonal aperture stops. Apertures stops can also be positioned so that the image radiation makes a double pass or a single pass through the aperture stop. Aperture stops can be interchanged in projection objective 101 and/or may have an adjustable aperture.

In some embodiments, projection objective 101 includes a field stop. For example, in embodiments where projective objective includes an intermediate image, the field stop can be positioned at or near the intermediate image.

Embodiments can include baffles (e.g., to shield the wafer from stray radiation). In some embodiments, projection objective 101 can include components (e.g., interferometers) for monitoring changes in the position of mirrors within the projection objective. This information can be used to adjust the mirrors to correct for any relative movement between the mirrors. Mirror adjustment can be automated. Examples of systems for monitoring/adjusting mirror position are disclosed in U.S. Pat. No. 6,549,270 B1.

Figure 11:
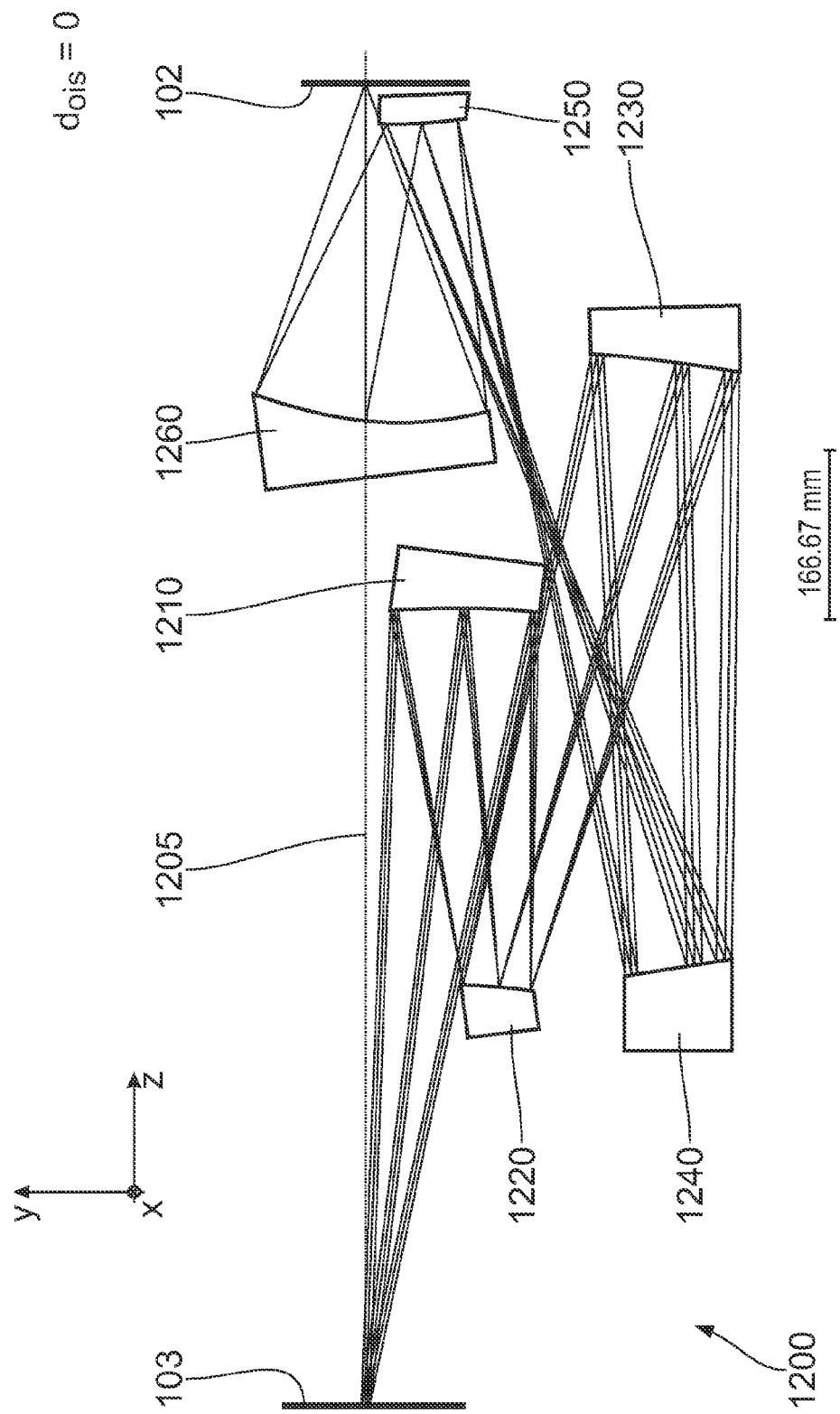
FIG. 11 is a cross-sectional view of a projection objective shown in meridional section.

Referring to FIG. 11, an embodiment of a projection objective 1200 includes six mirrors 1210, 1220, 1230, 1240, 1250, and 1260, and has an image-side numerical aperture of 0.35 and an operating wavelength of 13.5 nm. Mirrors 1210, 1220, 1230, 1240, 1250, and 1260 are all freeform mirrors. Projection objective 1200 images radiation from object plane 103 to image plane 102 with a demagnification ratio of 4×. A reference axis 1205, orthogonal to object plane 103 and image plane 102 intersects corresponding field points in the object and image fields. The tracklength of projection objective 1200 is 1385 mm and the optical path length of imaged radiation is 4162 mm. Accordingly, the ratio of the optical path length to tracklength is approximately 3.01. Projection objective 1200 has an aperture stop positioned at mirror 1220.

The entrance pupil of projection objective 1200 is at infinity with object plane positioned between the entrance pupil and the mirrors. The chief ray angle of the central field point at object plane 103 is 7°. The maximum variation of chief ray angles at object plane 103 is less than 0.06°. Projection objective 1200 is telecentric on the object side.

Projection objective 1200 has a rectangular field. The image-side field width, $d_x$, is 26 mm. The image-side field length, $d_y$, is 2 mm. Projection objective 1200 has zero object-image shift.

Projection objective 1200 provides an intermediate image between mirrors 1240 and 1250.

The optical power of the mirrors in the order of the radiation path from object plane 103 to image plane 102 is as follows: mirror 1210 has positive optical power; mirror 1220 has negative optical power; mirror 1230 has positive optical power; mirror 1240 has positive optical power; mirror 1250 has negative optical power; and mirror 1260 has positive optical power.

The dimension of the footprint of each mirror, given as $M_x \times M_y$, is as follows: 250 mm×153 mm for mirror 1210; 70 mm×69 mm for mirror 1020; 328 mm×153 mm for mirror 1230; 325 mm×112 mm for mirror 1240; 87 mm×75 mm for mirror 1250; and 269 mm×238 mm for mirror 1260.

The chief ray angle of incidence for the central field point is 6.13°, 10.61°, 8.65°, 8.26°, 14.22°, and 5.23° for mirrors 1210, 1220, 1230, 1240, 1250, and 1260, respectively. The maximum angle of incidence, $\theta_{max}$ on each mirror for the meridional section is 6.53°, 11.63°, 8.91°, 11.39°, 24.26°, and 7.44° for mirrors 1210, 1220, 1230, 1240, 1250, and 1260, respectively. $\Delta\theta$ for mirrors 1210, 1220, 1230, 1240, 1250, and 1260 are 1.07°, 3.64°, 1.74°, 7.44°, 21.70°, and 4.51°, respectively.

Mirrors 1210, 1220, 1250, and 1260 have freeboards that are more than 5 mm and less than 25 mm. Mirror 1240 has positive chief ray angle magnification while mirrors 1210, 1220, 1230, and 1250 have negative chief ray angle magnification.

The image-side free working distance of projection objective 1200 is 40 mm. The object-side free working distance is 439 mm.

In projection objective 1200, $d_{op-1}/d_{op-2}$ is 1.91. Furthermore, adjacent mirror pair 1240 and 1250 are separated by more than 50% of the projection objective's tracklength. Further, the distance between mirror 1210 and object plane 103 is more than 50% of the projection objective's tracklength.

Data for projection objective 1200 is presented in Table 2A and Table 2B below. Table 2A presents optical data, while Table 2B presents aspherical constants for each of the mirror surfaces. For the purposes of Table 2A and Table 2B, the mirror designations correlate as follows: mirror 1 (M1) corresponds to mirror 1210; mirror 2 (M2) corresponds to mirror 1220; mirror 3 (M3) corresponds to mirror 1230; mirror 4 (M4) corresponds to mirror 1240; mirror 5 (M5) corresponds to mirror 1250; and mirror 6 (M6) corresponds to mirror 1260.

TABLE 2A

| Surface | Radius (mm) | Thickness (mm) | Mode |
|---|---|---|---|
| Object | INFINITY | 836.375 | |
| Mirror 1 | −614.878 | −397.397 | REFL |
| Mirror 2 | −383.358 | 0.000 | REFL |
| STOP | INFINITY | 655.992 | |
| Mirror 3 | −1204.989 | −659.631 | REFL |
| Mirror 4 | 1885.915 | 909.840 | REFL |
| Mirror 5 | 302.954 | −308.805 | REFL |
| Mirror 6 | 403.492 | 348.850 | REFL |
| Image | INFINITY | 0.000 | |

TABLE 2B

| Coefficient | M1 | M2 | M3 | M4 | M5 | M6 |
|---|---|---|---|---|---|---|
| K | −6.673329E−01 | −2.825442E−01 | −1.843864E+00 | 2.076932E+00 | 3.340547E+00 | 1.990979E−01 |
| Y | −5.045837E−02 | 2.263660E−01 | −1.277806E−01 | −3.310548E−02 | −1.935522E−01 | 1.783092E−02 |
| $X^2$ | 1.827144E−04 | 1.686990E−04 | 9.963384E−05 | 5.203052E−05 | −3.849892E−04 | 3.792405E−05 |
| $Y^2$ | 1.737812E−04 | 2.093994E−04 | −1.747764E−05 | −7.184095E−05 | −3.329705E−04 | 1.662759E−05 |
| $X^2Y$ | 4.765150E−08 | −1.595967E−06 | −5.515151E−08 | −8.752119E−10 | 1.213426E−06 | 5.552151E−08 |
| $Y^3$ | 5.091508E−08 | −1.231538E−06 | −1.294839E−07 | −1.939381E−07 | 1.502735E−06 | 9.165146E−08 |
| $X^4$ | −4.718889E−11 | −6.941238E−09 | −7.002011E−11 | −5.996832E−11 | −2.342602E−09 | 9.552648E−12 |
| $X^2Y^2$ | −4.340357E−11 | −7.827867E−09 | −1.801185E−10 | −7.139217E−11 | −1.234047E−08 | −1.611525E−10 |
| $Y^4$ | 1.234053E−10 | −3.130174E−09 | −7.281275E−11 | −1.598859E−10 | −1.206604E−08 | −1.662004E−10 |
| $X^4Y$ | 1.205203E−13 | −6.495768E−11 | −3.614883E−14 | −4.344276E−14 | 2.268270E−11 | 2.930397E−13 |
| $X^2Y^3$ | 2.259661E−13 | −4.304439E−11 | −1.048629E−13 | −7.811421E−16 | 2.977954E−11 | 8.493936E−13 |
| $Y^5$ | −5.198478E−13 | −1.485266E−11 | 5.022687E−15 | −1.422459E−14 | −1.556209E−11 | 4.051187E−13 |
| $X^6$ | −1.306395E−16 | −4.159695E−14 | 0.000000E+00 | −3.767576E−17 | 1.374773E−14 | −9.890588E−17 |
| $X^4Y^2$ | 8.838986E−17 | 1.462867E−14 | 0.000000E+00 | −1.369883E−16 | −3.320990E−13 | −1.312584E−15 |
| $X^2Y^4$ | −1.745854E−16 | 4.353978E−13 | 0.000000E+00 | −7.920443E−17 | −1.008910E−13 | −2.069868E−15 |
| $Y^6$ | 1.020155E−15 | −1.927189E−13 | 0.000000E+00 | −3.431888E−17 | −9.148646E−14 | −6.650861E−16 |
| $X^6Y$ | 1.090627E−18 | 0.000000E+00 | 0.000000E+00 | 0.000000E+00 | 0.000000E+00 | 1.607288E−18 |
| $X^4Y^3$ | −4.158749E−19 | 0.000000E+00 | 0.000000E+00 | 0.000000E+00 | 0.000000E+00 | 4.652411E−18 |
| $X^2Y^5$ | −1.758731E−18 | 0.000000E+00 | 0.000000E+00 | 0.000000E+00 | 0.000000E+00 | 4.087290E−18 |
| $Y^7$ | −3.081679E−18 | 0.000000E+00 | 0.000000E+00 | 0.000000E+00 | 0.000000E+00 | 9.802736E−19 |
| $X^8$ | 0.000000E+00 | 0.000000E+00 | 0.000000E+00 | 0.000000E+00 | 0.000000E+00 | 0.000000E+00 |
| $X^6Y^2$ | 0.000000E+00 | 0.000000E+00 | 0.000000E+00 | 0.000000E+00 | 0.000000E+00 | 0.000000E+00 |
| $X^4Y^4$ | 0.000000E+00 | 0.000000E+00 | 0.000000E+00 | 0.000000E+00 | 0.000000E+00 | 0.000000E+00 |
| $X^2Y^6$ | 0.000000E+00 | 0.000000E+00 | 0.000000E+00 | 0.000000E+00 | 0.000000E+00 | 0.000000E+00 |
| $Y^8$ | 0.000000E+00 | 0.000000E+00 | 0.000000E+00 | 0.000000E+00 | 0.000000E+00 | 0.000000E+00 |
| $X^8Y$ | 0.000000E+00 | 0.000000E+00 | 0.000000E+00 | 0.000000E+00 | 0.000000E+00 | 0.000000E+00 |
| $X^6Y^3$ | 0.000000E+00 | 0.000000E+00 | 0.000000E+00 | 0.000000E+00 | 0.000000E+00 | 0.000000E+00 |

TABLE 2B-continued

| Coefficient | M1 | M2 | M3 | M4 | M5 | M6 |
|---|---|---|---|---|---|---|
| $X^4Y^5$ | 0.000000E+00 | 0.000000E+00 | 0.000000E+00 | 0.000000E+00 | 0.000000E+00 | 0.000000E+00 |
| $X^2Y^7$ | 0.000000E+00 | 0.000000E+00 | 0.000000E+00 | 0.000000E+00 | 0.000000E+00 | 0.000000E+00 |
| $Y^9$ | 0.000000E+00 | 0.000000E+00 | 0.000000E+00 | 0.000000E+00 | 0.000000E+00 | 0.000000E+00 |
| $X^{10}$ | 0.000000E+00 | 0.000000E+00 | 0.000000E+00 | 0.000000E+00 | 0.000000E+00 | 0.000000E+00 |
| $X^8Y^2$ | 0.000000E+00 | 0.000000E+00 | 0.000000E+00 | 0.000000E+00 | 0.000000E+00 | 0.000000E+00 |
| $X^6Y^4$ | 0.000000E+00 | 0.000000E+00 | 0.000000E+00 | 0.000000E+00 | 0.000000E+00 | 0.000000E+00 |
| $X^4Y^6$ | 0.000000E+00 | 0.000000E+00 | 0.000000E+00 | 0.000000E+00 | 0.000000E+00 | 0.000000E+00 |
| $X^2Y^8$ | 0.000000E+00 | 0.000000E+00 | 0.000000E+00 | 0.000000E+00 | 0.000000E+00 | 0.000000E+00 |
| $Y^{10}$ | 0.000000E+00 | 0.000000E+00 | 0.000000E+00 | 0.000000E+00 | 0.000000E+00 | 0.000000E+00 |
| Nradius | 1.00E+00 | 1.00E+00 | 1.00E+00 | 1.00E+00 | 1.00E+00 | 1.00E+00 |
| Y-decenter | −118.847 | −100.000 | 100.000 | 24.472 | −11.760 | −37.772 |
| X-rotation | −7.782 | 7.388 | 1.406 | −2.140 | −8.177 | 6.989 |

Figure 12:
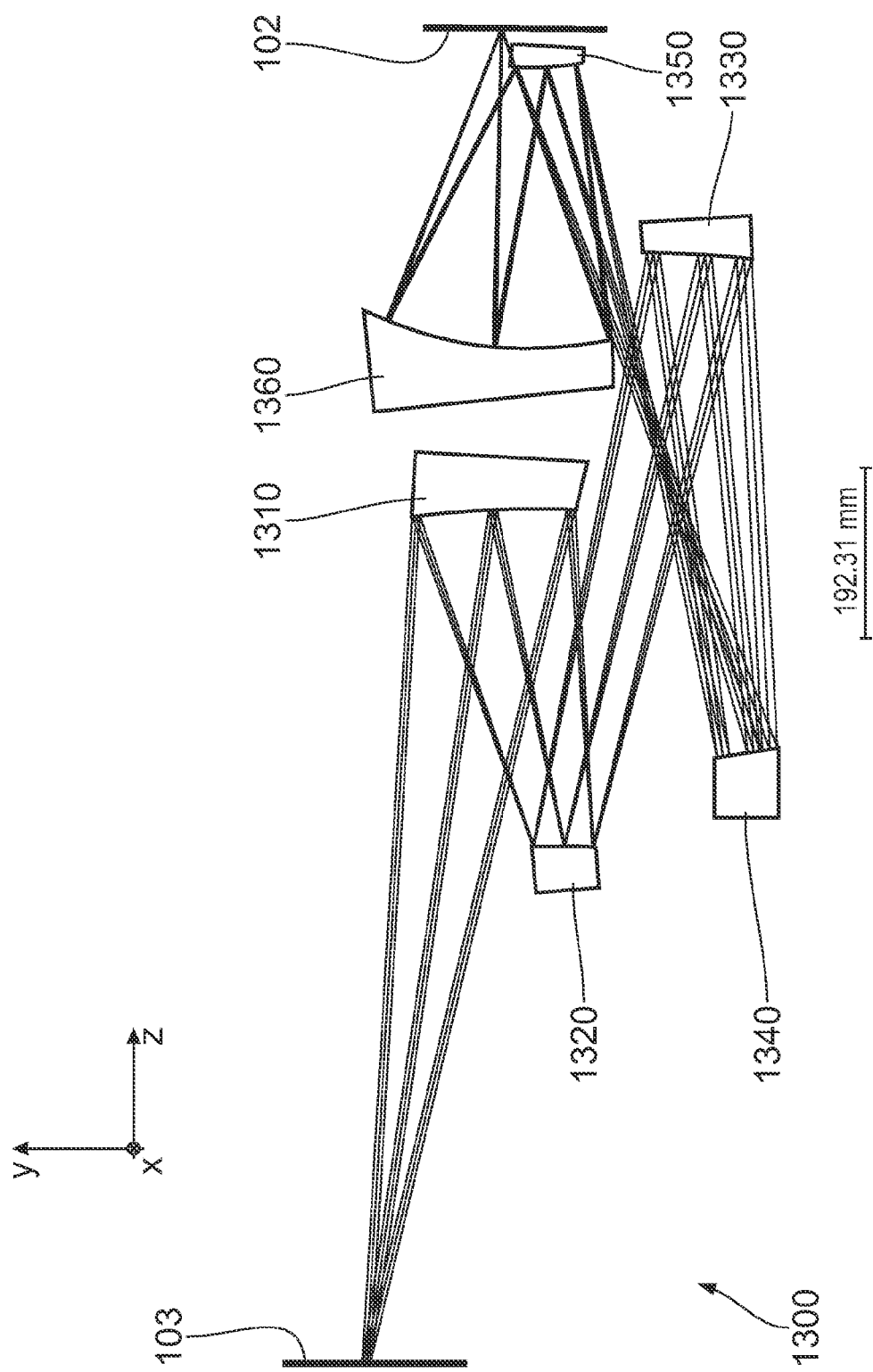
FIG. 12 is a cross-sectional view of a projection objective shown in meridional section.

Referring to FIG. 12, an embodiment of a projection objective 1300 includes six mirrors 1310, 1320, 1330, 1340, 1350, and 1360, and has an image-side numerical aperture of 0.35 and an operating wavelength of 13.5 nm. Mirrors 1310, 1320, 1330, 1340, 1350, and 1360 are all freeform mirrors. Projection objective 1300 images radiation from object plane 103 to image plane 102 with a demagnification ratio of 4×. The tracklength of projection objective 1300 is 1500 mm and the optical path length of imaged radiation is 4093 mm. Accordingly, the ratio of the optical path length to tracklength is approximately 2.73. Projection objective 1300 has an aperture stop positioned at mirror 1320.

The entrance pupil of projection objective 1300 is at infinity. The chief ray angle of the central field point at object plane 103 is 7°. The maximum variation of chief ray angles at object plane 103 is less than 0.1°. Projection objective 1300 is telecentric on the object side.

Projection objective 1300 has a rectangular field. The image-side field width, $d_x$, is 26 mm. The image-side field length, $d_y$, is 2 mm. Projection objective 1000 has an object-image shift of 119 mm.

Projection objective 1300 provides an intermediate image between mirrors 1340 and 1350.

The optical power of the mirrors in the order of the radiation path from object plane 103 to image plane 102 is as follows: mirror 1310 has positive optical power; mirror 1320 has negative optical power; mirror 1330 has positive optical power; mirror 1340 has positive optical power; mirror 1350 has negative optical power; and mirror 1360 has positive optical power.

The dimension of the footprint of each mirror, given as $M_x \times M_y$, is as follows: 271 mm×173 mm for mirror 1310; 69 mm×65 mm for mirror 1320; 290 mm×115 mm for mirror 1330; 272 mm×66 mm for mirror 1340; 81 mm×67 mm for mirror 1350; and 274 mm×243 mm for mirror 1360.

The chief ray angle of incidence for the central field point is 9.66°, 12.15°, 9.10°, 5.45°, 13.31°, and 4.60° for mirrors 1310, 1320, 1330, 1340, 1350, and 1360, respectively. The maximum angle of incidence, $\theta_{max}$, on each mirror for the meridional section is 11.20°, 15.46°, 9.63°, 8.64°, 23.31°, and 6.17° for mirrors 1310, 1320, 1330, 1340, 1350, and 1360, respectively. $\Delta\theta$ for mirrors 1310, 1320, 1330, 1340, 1350, and 1360 are 3.25°, 7.32°, 1.57°, 6.92°, 21.18°, and 3.63°, respectively.

Mirror 1340 has positive chief ray angle magnification while mirrors 1310, 1320, 1330, and 1350 have negative chief ray angle magnification.

The image-side free working distance of projection objective 1300 is 40 mm. The object-side free working distance is 582 mm.

In projection objective 1300, $d_{op-1}/d_{op-2}$ is 1.63. Furthermore, adjacent mirror pairs 1340 and 1350 is separated by more than 50% of the projection objective's tracklength. Further, the distance between mirror 1310 and object plane 103 is more than 50% of the projection objective's tracklength.

Data for projection objective 1300 is presented in Table 3A and Table 3B below. Table 3A presents optical data, while Table 3B presents aspherical constants for each of the mirror surfaces. For the purposes of Table 3A and Table 3B, the mirror designations correlate as follows: mirror 1 (M1) corresponds to mirror 1310; mirror 2 (M2) corresponds to mirror 1320; mirror 3 (M3) corresponds to mirror 1330; mirror 4 (M4) corresponds to mirror 1340; mirror 5 (M5) corresponds to mirror 1350; and mirror 6 (M6) corresponds to mirror 1360.

TABLE 3A

| Surface | Radius (mm) | Thickness (mm) | Mode |
|---|---|---|---|
| Object | INFINITY | 946.404 | |
| Mirror 1 | −605.890 | −364.901 | REFL |
| Mirror 2 | −368.417 | 0.000 | REFL |
| STOP | INFINITY | 626.468 | |
| Mirror 3 | −1202.217 | −556.441 | REFL |
| Mirror 4 | 1949.768 | 808.432 | REFL |
| Mirror 5 | 276.499 | −313.562 | REFL |
| Mirror 6 | 401.291 | 353.600 | REFL |
| Image | INFINITY | 0.000 | |

TABLE 3B

| Coefficient | M1 | M2 | M3 | M4 | M5 | M6 |
|---|---|---|---|---|---|---|
| K | −5.95606E−01 | −1.82166E+00 | −5.82444E−01 | −2.38948E+00 | 3.35329E+00 | 1.67263E−01 |
| Y | 1.96214E−02 | 1.05243E−01 | −1.91165E−01 | −6.23536E−02 | −4.99892E−02 | 1.30034E−02 |
| $X^2$ | 1.71425E−04 | 1.61788E−04 | 8.52106E−05 | 7.49004E−05 | −2.48914E−04 | 3.88103E−05 |
| $Y^2$ | 1.59322E−04 | 1.15506E−04 | −1.78602E−05 | −9.20778E−05 | −2.00659E−04 | 4.01025E−05 |
| $X^2Y$ | 3.03035E−08 | −8.08249E−07 | −6.98999E−08 | −6.74632E−08 | 7.56105E−07 | 5.29501E−09 |
| $Y^3$ | 2.86899E−08 | −3.26183E−07 | −9.54345E−08 | −1.51650E−07 | 2.54367E−07 | 8.86827E−09 |
| $X^4$ | 0.00000E+00 | 0.00000E+00 | 0.00000E+00 | 0.00000E+00 | 0.00000E+00 | 0.00000E+00 |
| $X^2Y^2$ | 0.00000E+00 | 0.00000E+00 | 0.00000E+00 | 0.00000E+00 | 0.00000E+00 | 0.00000E+00 |
| $Y^4$ | 0.00000E+00 | 0.00000E+00 | 0.00000E+00 | 0.00000E+00 | 0.00000E+00 | 0.00000E+00 |

TABLE 3B-continued

| Coefficient | M1 | M2 | M3 | M4 | M5 | M6 |
|---|---|---|---|---|---|---|
| $X^4Y$ | 0.00000E+00 | 0.00000E+00 | 0.00000E+00 | 0.00000E+00 | 0.00000E+00 | 0.00000E+00 |
| $X^2Y^3$ | 0.00000E+00 | 0.00000E+00 | 0.00000E+00 | 0.00000E+00 | 0.00000E+00 | 0.00000E+00 |
| $Y^5$ | 0.00000E+00 | 0.00000E+00 | 0.00000E+00 | 0.00000E+00 | 0.00000E+00 | 0.00000E+00 |
| $X^6$ | 0.00000E+00 | 0.00000E+00 | 0.00000E+00 | 0.00000E+00 | 0.00000E+00 | 0.00000E+00 |
| $X^4Y^2$ | 0.00000E+00 | 0.00000E+00 | 0.00000E+00 | 0.00000E+00 | 0.00000E+00 | 0.00000E+00 |
| $X^2Y^4$ | 0.00000E+00 | 0.00000E+00 | 0.00000E+00 | 0.00000E+00 | 0.00000E+00 | 0.00000E+00 |
| $Y^6$ | 0.00000E+00 | 0.00000E+00 | 0.00000E+00 | 0.00000E+00 | 0.00000E+00 | 0.00000E+00 |
| $X^6Y$ | 0.00000E+00 | 0.00000E+00 | 0.00000E+00 | 0.00000E+00 | 0.00000E+00 | 0.00000E+00 |
| $X^4Y^3$ | 0.00000E+00 | 0.00000E+00 | 0.00000E+00 | 0.00000E+00 | 0.00000E+00 | 0.00000E+00 |
| $X^2Y^5$ | 0.00000E+00 | 0.00000E+00 | 0.00000E+00 | 0.00000E+00 | 0.00000E+00 | 0.00000E+00 |
| $Y^7$ | 0.00000E+00 | 0.00000E+00 | 0.00000E+00 | 0.00000E+00 | 0.00000E+00 | 0.00000E+00 |
| $X^8$ | 0.00000E+00 | 0.00000E+00 | 0.00000E+00 | 0.00000E+00 | 0.00000E+00 | 0.00000E+00 |
| $X^6Y^2$ | 0.00000E+00 | 0.00000E+00 | 0.00000E+00 | 0.00000E+00 | 0.00000E+00 | 0.00000E+00 |
| $X^4Y^4$ | 0.00000E+00 | 0.00000E+00 | 0.00000E+00 | 0.00000E+00 | 0.00000E+00 | 0.00000E+00 |
| $X^2Y^6$ | 0.00000E+00 | 0.00000E+00 | 0.00000E+00 | 0.00000E+00 | 0.00000E+00 | 0.00000E+00 |
| $Y^8$ | 0.00000E+00 | 0.00000E+00 | 0.00000E+00 | 0.00000E+00 | 0.00000E+00 | 0.00000E+00 |
| $X^8Y$ | 0.00000E+00 | 0.00000E+00 | 0.00000E+00 | 0.00000E+00 | 0.00000E+00 | 0.00000E+00 |
| $X^6Y^3$ | 0.00000E+00 | 0.00000E+00 | 0.00000E+00 | 0.00000E+00 | 0.00000E+00 | 0.00000E+00 |
| $X^4Y^5$ | 0.00000E+00 | 0.00000E+00 | 0.00000E+00 | 0.00000E+00 | 0.00000E+00 | 0.00000E+00 |
| $X^2Y^7$ | 0.00000E+00 | 0.00000E+00 | 0.00000E+00 | 0.00000E+00 | 0.00000E+00 | 0.00000E+00 |
| $Y^9$ | 0.00000E+00 | 0.00000E+00 | 0.00000E+00 | 0.00000E+00 | 0.00000E+00 | 0.00000E+00 |
| $X^{10}$ | 0.00000E+00 | 0.00000E+00 | 0.00000E+00 | 0.00000E+00 | 0.00000E+00 | 0.00000E+00 |
| $X^8Y^2$ | 0.00000E+00 | 0.00000E+00 | 0.00000E+00 | 0.00000E+00 | 0.00000E+00 | 0.00000E+00 |
| $X^6Y^4$ | 0.00000E+00 | 0.00000E+00 | 0.00000E+00 | 0.00000E+00 | 0.00000E+00 | 0.00000E+00 |
| $X^4Y^6$ | 0.00000E+00 | 0.00000E+00 | 0.00000E+00 | 0.00000E+00 | 0.00000E+00 | 0.00000E+00 |
| $X^2Y^8$ | 0.00000E+00 | 0.00000E+00 | 0.00000E+00 | 0.00000E+00 | 0.00000E+00 | 0.00000E+00 |
| $Y^{10}$ | 0.00000E+00 | 0.00000E+00 | 0.00000E+00 | 0.00000E+00 | 0.00000E+00 | 0.00000E+00 |
| Nradius | 1.00E+00 | 1.00E+00 | 1.00E+00 | 1.00E+00 | 1.00E+00 | 1.00E+00 |
| Y-decenter | −200.000 | −82.208 | 200.000 | 44.996 | −23.759 | −73.032 |
| X-rotation | −11.492 | 6.153 | 4.904 | −0.617 | −3.814 | 7.081 |

Figure 13:
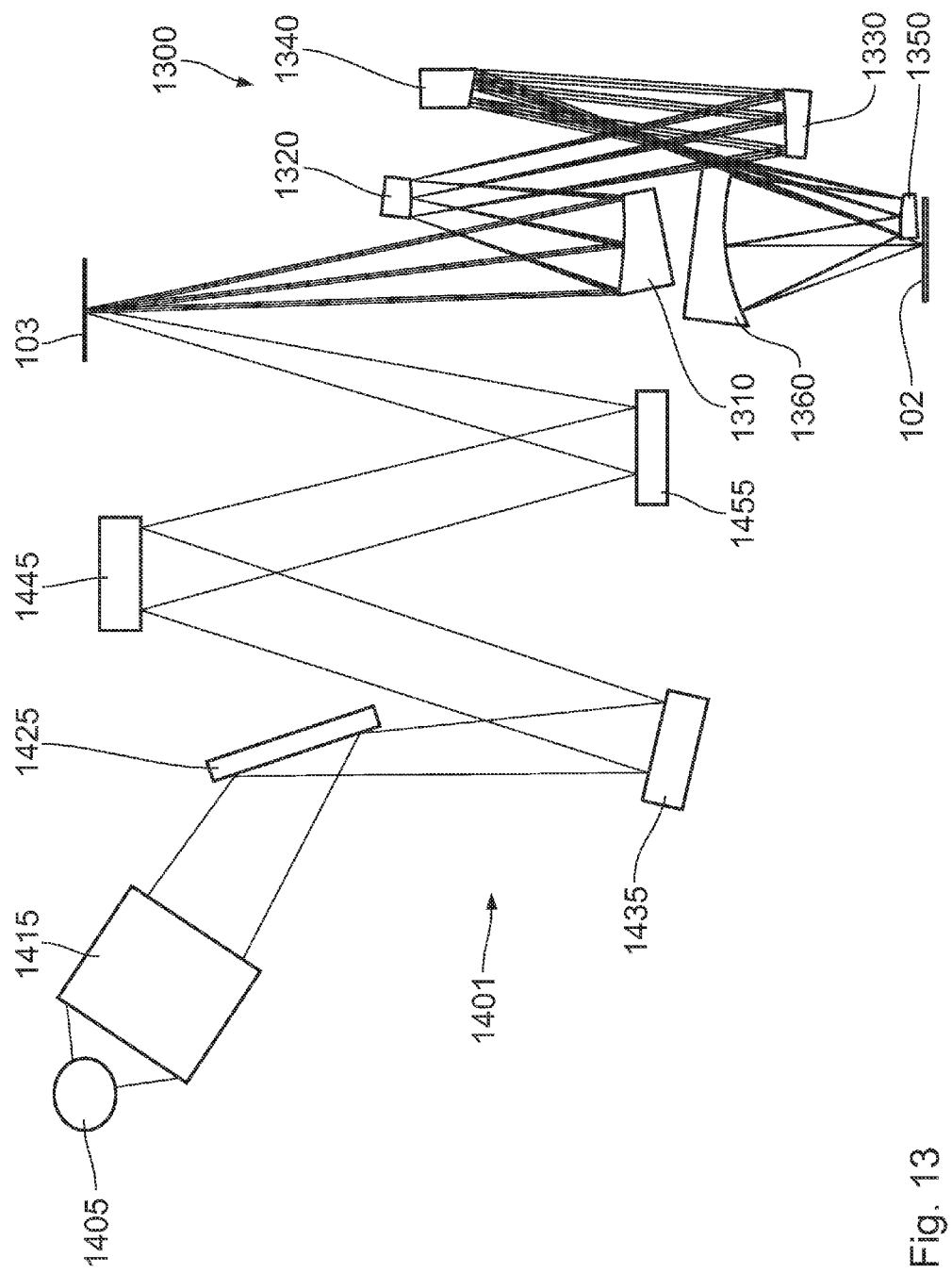
FIG. 13 is a cross-sectional view of an optical system that includes the projection objective shown in FIG. 12.

Referring to FIG. 13, projection objective 1300 can be used in an optical system 1401 that includes a light source 1405 and illumination optics including a collector unit 1415, a spectral purity filter 1425, a field facet mirror 1435, a pupil facet mirror 1445 and a focusing mirror 1455. Light source 1405 is an EUV light source configured to provide radiation at 13.5 nm to the projection objective. Collector unit 1415 gathers radiation from source 1405 and directs the radiation towards spectral purity filter 1415 which filters incident radiation at wavelengths other than 13.5 nm and directs the radiation at 13.5 nm towards field facet mirror 1435. Together with pupil facet mirror 1445 and focusing mirror 1455, field facet mirror illuminates a reflective reticle positioned at object plane 103 with radiation at 13.5 nm.

Other embodiments are in the claims.

What is claimed is:

1. An optical system, comprising:
a plurality of optical elements arranged to image radiation from an object field in an object plane to an image field in an image plane,
wherein the system has an entrance pupil located more than 2.8 m from the object plane, a path of the radiation of the system has chief rays that are at an angle of 3° or more with respect to a normal at the object plane, the image field has a minimum radius of 300 mm, at the object plane all chief rays are parallel to each other within 0.5°, and the system is a microlithography projection optical system.

2. The optical system of claim 1, wherein the chief rays are at an angle of 4° or more with respect to the normal at the object plane.

3. The optical system of claim 1, further comprising a reflective object to be imaged in the object field.

4. The optical system of claim 1, wherein the system is a catoptric projection objective.

5. The optical system of claim 1, wherein at least one of the plurality of optical elements is a reflective element having a rotationally asymmetric surface positioned in a path of the radiation, and the rotationally asymmetric surface deviates from a best-fit rotationally symmetric surface by λ or more at one or more locations, where λ is a wavelength of the radiation.

6. The optical system of claim 5, wherein the best-fit rotationally asymmetric surface deviates by about 0.1 or less from a surface corresponding to the equation:

$$z = \frac{cr^2}{1 + \sqrt{1 - (1+k)c^2 r^2}} + \sum_{j=2}^{\alpha} C_j x^m y^n$$

where $$j = \frac{(m+n)^2 + m + 3n}{2} + 1,$$

z is the sag of the surface parallel to an axis, c is the vertex curvature and k is the conical constant, $C_j$ is the coefficient of the monomial $x^m y^n$, and α is an integer.

7. The optical system of claim 5, wherein the rotationally asymmetric surface deviates from the best-fit rotationally symmetric surface by about 10λ or more at the one or more locations.

8. The optical system of claim 5, wherein the rotationally asymmetric surface deviates from the best-fit rotationally symmetric surface by about 20 nm or more at the one or more locations.

9. The optical system of claim 1, wherein the plurality of reflective elements define a meridional plane, and the plurality of reflective elements are mirror symmetric with respect to the meridional plane.

10. The optical system of claim 1, wherein the plurality of elements comprises two elements that are reflective elements that have rotationally asymmetric surfaces positioned in a path of the radiation.

11. The optical system of claim 1, wherein the plurality of reflective elements includes no more than two reflective elements that have a positive chief ray angle magnification.

12. The optical system of claim 1, wherein the plurality of reflective elements includes no more than one reflective element that has a positive chief ray angle magnification.

13. The optical system of claim 1, wherein the system has an image-side numerical aperture of about 0.2 or more.

14. The optical system of claim 1, wherein the system has a rectangular field at the image plane, and the rectangular field in each of the orthogonal directions has a minimum dimension of about 1 mm or more.

15. The optical system of claim 1, wherein static distortion at the image field is about 10 nm or less.

16. The optical system of claim 1, wherein wavefront error at the image field is about $\lambda/14$ or less.

17. The optical system of claim 1, wherein all chief rays are parallel to each other to within 0.05° at the object plane.

18. The optical system of claim 1, wherein the plurality of reflective elements is telecentric at the image plane.

19. The optical system of claim 1, wherein the system has an object-image shift of about 75 mm or less.

20. A tool, comprising:
an illumination system; and
a projection optical system, comprising:
a plurality of optical elements arranged to image radiation from an object field in an object plane of the projection optical system to an image field in an image plane of the projection optical system,
wherein the projection optical system has an entrance pupil located more than 2.8 m from the object plane, a path of the radiation of the system has chief rays that are at an angle of 3° or more with respect to a normal at the object plane of the projection optical system, the image field has a minimum radius of 300 mm, at the object plane all chief rays are parallel to each other within 0.5°, and the tool is a microlithography tool.

21. The tool of claim 20, wherein the illumination system, comprises:
one or more elements arranged to direct radiation from a radiation source to an object positioned at the object plane of the projection optical system; and
an element positioned at a location corresponding to the entrance pupil of the projection optical system.

22. The tool of claim 21, further comprising the radiation source.

23. The tool of claim 20, wherein the illumination system, comprises:
one or more elements arranged to direct radiation from the radiation source to an object positioned at the object plane of the projection optical system; and
an element positioned at a location corresponding to an entrance pupil of the optical system.

24. A method, comprising using the tool of claim 20 to produce micro structured components.

25. The tool of claim 20, wherein all chief rays are parallel to each other to within 0.05° at the object plane.

26. A tool, comprising:
a projection optical system comprising a plurality of optical elements arranged to image radiation having a wave length $\lambda$ from an object field in an object plane of the projection optical system to an image field in an image plane of the projection optical system, and a path of the radiation having the wave length $\lambda$ having chief rays that are at an angle of 3° or more with respect to a normal at the object plane of the projection optical system, wherein at the object plane all chief rays are parallel to each other within 0.5°;
a radiation source configured to provide the radiation having the wave length $\lambda$ to the object plane of the projection optical system, where $\lambda$ is 30 nm or less; and
an illumination system having one or more elements arranged to direct radiation from the radiation source to the object plane of the projection optical system,
wherein the tool is a microlithography tool.

27. A method, comprising using the tool of claim 26 to produce micro-structured components.

28. An optical system, comprising:
a plurality of optical elements arranged to image radiation from an object field in an object plane to an image field in an image plane,
wherein the system has an entrance pupil located more than 2.8 m from the object plane, a path of the radiation of the system has chief rays that are at an angle of 3° or more with respect to a normal at the object plane, and the system is a microlithography projection optical system, and
wherein:
for a meridional section of the optical system, the chief ray of a central field point has a maximum angle of incidence on a surface of each of the elements of $\theta$ degrees;
the optical system has an image side numeral aperture, NA, of more than 0.3; and
a ratio $\theta$/NA is less than 68.

29. A tool, comprising:
an illumination system; and
a projection optical system, comprising:
a plurality of optical elements arranged to image radiation from an object field in an object plane of the projection optical system to an image field in an image plane of the projection optical system,
wherein the projection optical system has an entrance pupil located more than 2.8 m from the object plane, a path of the radiation of the system has chief rays that are at an angle of 3° or more with respect to a normal at the object plane of the projection optical system, and the tool is a microlithography tool, and
wherein:
for a meridional section of the projection optical system, the chief ray of a central field point has a maximum angle of incidence on a surface of each of the elements of $\theta$ degrees;
the projection optical system has an image side numeral aperture, NA, of more than 0.3; and
a ratio $\theta$/NA is less than 68.

30. A method, comprising using the tool of claim 29 to product micro-structured components.

31. An optical system, comprising:
a plurality of optical elements arranged to image radiation from an object field in an object plane to an image field in an image plane,
wherein:
the system has an entrance pupil located more than 2.8 m from the object plane, a path of the radiation of the system has chief rays that are at an angle of 3° or more with respect to a normal at the object plane;
at least one of the plurality of optical elements is a reflective element having a rotationally asymmetric surface positioned in a path of the radiation, and the rotationally asymmetric surface deviates from a best-fit rotationally symmetric surface by λ or more at one or more locations, where λ is a wavelength of the radiation; and the system is a microlithography projection optical system.

32. The optical system of claim 31, wherein the best-fit rotationally asymmetric surface deviates by about 0.1λ or less from a surface corresponding to the equation:

$$z = \frac{cr^2}{1+\sqrt{1-(1+k)c^2r^2}} + \sum_{j=2}^{\alpha} C_j x^m y^n$$

where $$j = \frac{(m+n)^2 + m + 3n}{2} + 1,$$

z is the sag of the surface parallel to an axis, c is the vertex curvature and k is the conical constant, $C_j$ is the coefficient of the monomial $x^m y^n$, and α is an integer.

33. The optical system of claim 31, wherein the rotationally asymmetric surface deviates from the best-fit rotationally symmetric surface by about 10λ or more at the one or more locations.

34. The optical system of claim 31, wherein the rotationally asymmetric surface deviates from the best-fit rotationally symmetric surface by about 20 nm or more at the one or more locations.

\* \* \* \* \*

UNITED STATES PATENT AND TRADEMARK OFFICE
CERTIFICATE OF CORRECTION

Page 1 of 2

PATENT NO. : 8,970,819 B2
APPLICATION NO. : 12/235957
DATED : March 3, 2015
INVENTOR(S) : Hans-Juergen Mann and Wilhelm Ulrich It is certified that error appears in the above-identified patent and that said Letters Patent is hereby corrected as shown below:

On Title Page 2, col. 2, line 18, item 56 under "OTHER PUBLICATIONS", delete "2009-503 430," and insert --2009-503430,--.

In the Specification

Col. 2, line 63, delete "about mm" and insert --about 5 mm--.

Col. 17, line 59, delete "Al$_2$O$_3$" and insert --Al$_2$O$_3$.--.

Col. 18, line 43, delete "10°" and insert --100--.

Col. 18, line 44, delete "8°" and insert --80--.

Col. 18, line 44, delete "7°" and insert --70--.

Col. 18, line 45, delete "5°" and insert --50--.

Col. 18, line 45, delete "4°" and insert --40--.

Col. 18, line 45, delete "3°" and insert --30--.

Col. 18, line 50, delete "θdCR," and insert --θ$_{CR}$,--.

Col. 18, line 57, delete "10°" and insert --100--.

Col. 18, line 58, delete "8°" and insert --80--.

Col. 18, line 58, delete "7°" and insert --70--.

Signed and Sealed this
Eighth Day of September, 2015

Michelle K. Lee
*Director of the United States Patent and Trademark Office*

CERTIFICATE OF CORRECTION (continued)
U.S. Pat. No. 8,970,819 B2

Col. 18, line 58, delete "6°" and insert --60--.

Col. 18, line 59, delete "5°" and insert --50--.

Col. 18, line 59, delete "4°" and insert --40--.

Col. 18, line 59, delete "3°" and insert --30--.

Col. 25, line 39, delete "$\theta_{max}$" and insert --$\theta_{max}$,--.

In the Claims

Col. 32, line 54, Claim 30, delete "product" and insert --produce--.